United States Patent
Glass et al.

(10) Patent No.: US 11,444,166 B2
(45) Date of Patent: Sep. 13, 2022

(54) BACKSIDE SOURCE/DRAIN REPLACEMENT FOR SEMICONDUCTOR DEVICES WITH METALLIZATION ON BOTH SIDES

(71) Applicant: INTEL CORPORATION, Santa Clara, CA (US)

(72) Inventors: Glenn A. Glass, Portland, OR (US); Karthik Jambunathan, Hillsboro, OR (US); Anand S. Murthy, Portland, OR (US); Chandra S. Mohapatra, Hillsboro, OR (US); Patrick Morrow, Portland, OR (US); Mauro J. Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/082,726

(22) Filed: Oct. 28, 2020

(65) Prior Publication Data

US 2021/0074823 A1    Mar. 11, 2021

Related U.S. Application Data

(63) Continuation of application No. 16/327,198, filed as application No. PCT/US2016/054710 on Sep. 30, 2016, now Pat. No. 10,892,337.

(51) Int. Cl.
*H01L 21/74* (2006.01)
*H01L 29/417* (2006.01)
(Continued)

(52) U.S. Cl.
CPC .. *H01L 29/41766* (2013.01); *H01L 21/76898* (2013.01); *H01L 21/823418* (2013.01);
(Continued)

(58) Field of Classification Search
None
See application file for complete search history.

(56) References Cited

U.S. PATENT DOCUMENTS

| | | | |
|---|---|---|---|
| 6,214,679 B1 * | 4/2001 | Murthy | H01L 29/41783 257/E21.165 |
| 2007/0194387 A1 * | 8/2007 | Dyer | H01L 21/823871 257/369 |

(Continued)

FOREIGN PATENT DOCUMENTS

| JP | 2013093371 A | 5/2013 |
|---|---|---|
| WO | 2018063302 A1 | 4/2018 |

OTHER PUBLICATIONS

Notice of Allowance from Taiwan Patent Application No. 106128464, dated Oct. 28, 2021, 3 pages.
(Continued)

*Primary Examiner* — Joseph C. Nicely
*Assistant Examiner* — Lamont B Koo
(74) *Attorney, Agent, or Firm* — Schwabe, Williamson & Wyatt, P.C.

(57) ABSTRACT

Techniques are disclosed for backside source/drain (S/D) replacement for semiconductor devices with metallization on both sides (MOBS). The techniques described herein provide methods to recover or otherwise facilitate low contact resistance, thereby reducing or eliminating parasitic external resistance that degrades transistor performance. In some cases, the techniques include forming sacrificial S/D material and a seed layer during frontside processing of a device layer including one or more transistor devices. The device layer can then be inverted and bonded to a host wafer. A backside reveal of the device layer can then be performed via grinding, etching, and/or CMP processes. The sacrificial S/D material can then be removed through backside S/D contact trenches using the seed layer as an etch stop,
(Continued)

followed by the formation of relatively highly doped final S/D material grown from the seed layer, to provide enhanced ohmic contact properties. Other embodiments may be described and/or disclosed.

20 Claims, 27 Drawing Sheets

(51) Int. Cl.
    *H01L 21/8238* (2006.01)
    *H01L 27/092* (2006.01)
    *H01L 21/768* (2006.01)
    *H01L 21/84* (2006.01)
    *H01L 27/12* (2006.01)
    *H01L 29/66* (2006.01)
    *H01L 23/48* (2006.01)
    *H01L 21/8234* (2006.01)
    *H01L 27/088* (2006.01)
    *H01L 29/06* (2006.01)
    *H01L 29/78* (2006.01)
    *H01L 23/485* (2006.01)

(52) U.S. Cl.
CPC ........ *H01L 21/823431* (2013.01); *H01L 21/823814* (2013.01); *H01L 21/823821* (2013.01); *H01L 21/823871* (2013.01); *H01L 21/845* (2013.01); *H01L 23/481* (2013.01); *H01L 27/0886* (2013.01); *H01L 27/0924* (2013.01); *H01L 27/1211* (2013.01); *H01L 29/0669* (2013.01); *H01L 29/41791* (2013.01); *H01L 29/66* (2013.01); *H01L 29/66795* (2013.01); *H01L 29/7851* (2013.01); *H01L 23/485* (2013.01)

(56) References Cited

U.S. PATENT DOCUMENTS

| | | | |
|---|---|---|---|
| 2008/0102573 A1* | 5/2008 | Liang | H01L 29/66636 438/231 |
| 2008/0308878 A1* | 12/2008 | Bulucea | H01L 21/823892 257/371 |
| 2010/0181547 A1* | 7/2010 | Kuroda | H01L 27/2436 257/2 |
| 2013/0130497 A1 | 5/2013 | Kim et al. | |
| 2015/0236016 A1 | 8/2015 | Wann et al. | |
| 2015/0380463 A1 | 12/2015 | Yokoyama | |
| 2015/0380556 A1 | 12/2015 | Ching | |
| 2016/0043082 A1 | 2/2016 | Greene et al. | |
| 2016/0211264 A1 | 7/2016 | Peng | |
| 2016/0254231 A1 | 9/2016 | Stuber | |
| 2017/0125595 A1 | 5/2017 | Chiu | |
| 2019/0221649 A1 | 7/2019 | Glass et al. | |

OTHER PUBLICATIONS

Office Action from Taiwan Patent Application No. 106128464, dated Dec. 28, 2020, 11 pages.
International Search Report and Written Opinion received for PCT/US2016/054710, dated Jun. 26, 2017. 15 pages.
International Preliminary Report on Patentability received for PCT/US2016/054710, dated Apr. 2, 2019. 11 pages.
Office Action from Taiwan Patent Application No. 110139700, dated Dec. 13, 2021, 7 pages.
Office Action from Chinese Patent Application No. 201680088794.9, dated Dec. 27, 2021, 7 pages.
Notice of Allowance from Taiwan Patent Application No. 110139700, dated Apr. 11, 2022, 3 pages.
Notice of Allowance from Chinese Patent Application No. 201680088794.9, dated May 24, 2022, 4 pages.

* cited by examiner

Transfer Wafer (inverted) 20

Host Wafer 30

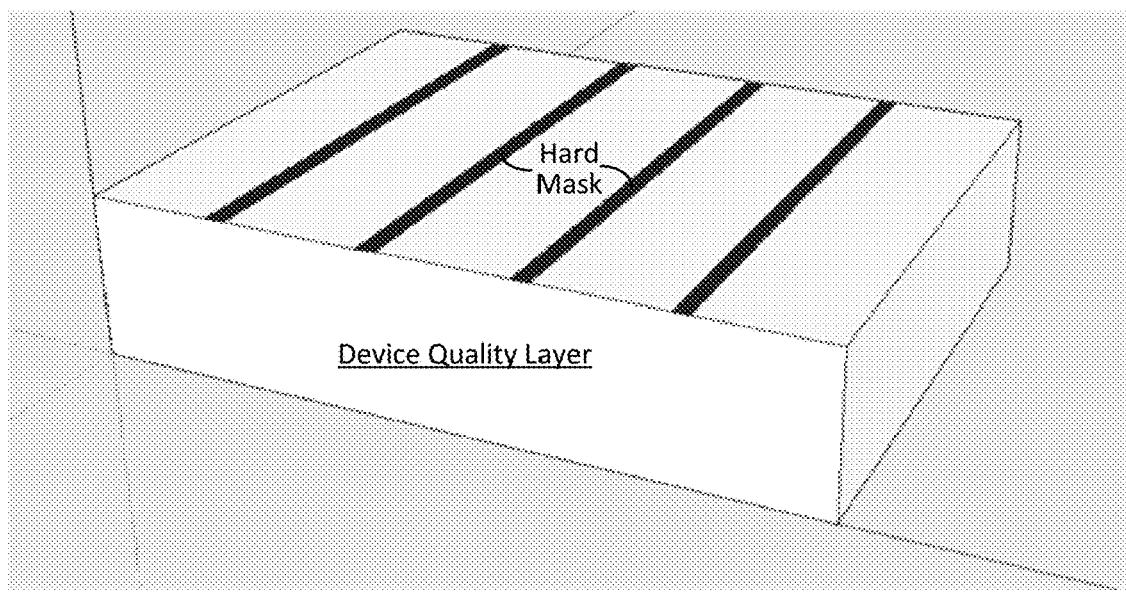
FIG. 7A
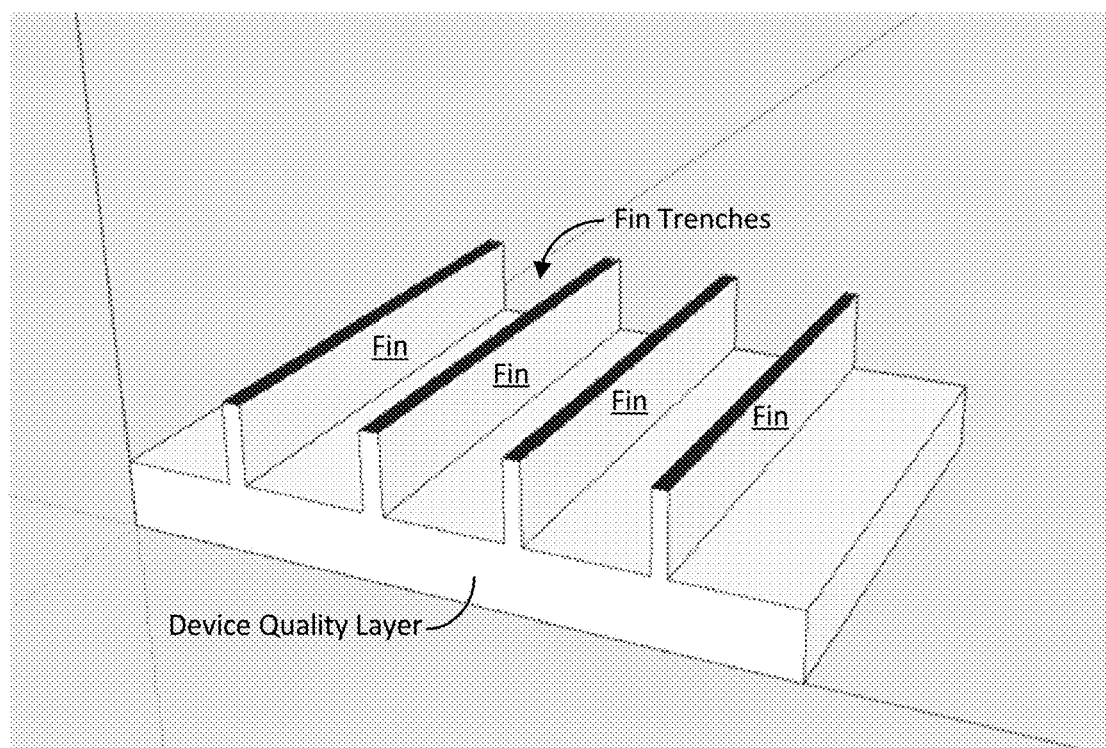
FIG. 7B
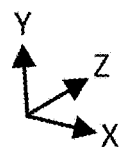

BACKSIDE SOURCE/DRAIN REPLACEMENT FOR SEMICONDUCTOR DEVICES WITH METALLIZATION ON BOTH SIDES

CROSS REFERENCE TO RELATED APPLICATIONS

This application is a continuation of and claims the benefit under 35 U.S.C. § 120 of U.S. patent application Ser. No. 16/327,198, filed on Feb. 21, 2019, entitled "BACKSIDE SOURCE/DRAIN REPLACEMENT FOR SEMICONDUCTOR DEVICES WITH METALLIZATION ON BOTH SIDES," which is a 371 of PCT Application No. PCT/US2016/054710, filed on Sep. 30, 2016, both of which are incorporated herein by reference in their entireties for all purposes.

BACKGROUND

Semiconductor devices are electronic components that exploit the electronic properties of semiconductor materials, such as silicon, germanium, and gallium arsenide. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called, the body or substrate, which can be used to bias the transistor. In addition, metal-oxide-semiconductor FETs (MOSFETs) include a gate dielectric layer between the gate and the channel. A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a nanoribbon transistor, depending on the height of the wire) is configured similarly to a fin-based transistor, but instead of a finned channel region where the gate is on two or three portions (and thus, there are two or three effective gates), one or more nanowires are used to form the channel. In such cases, the gate material generally is on four portions or otherwise surrounds each nanowire, thereby providing a so-called gate-all-around channel.

Integrated circuit (IC) fabrication primarily includes two portions: the front-end or front-end-of-line (FEOL) and the back-end or back-end-of-line (BEOL). The front-end or FEOL is the first portion of IC fabrication where individual semiconductor devices are formed, including all processes up to the deposition of metal interconnect layers. The back-end or BEOL, not to be confused with far-back-end chip fabrication, is the second portion of IC fabrication where the individual semiconductor devices get interconnected with metal wiring. BEOL may include any number of metallization layers, depending on the target application or end use.

BRIEF DESCRIPTION OF THE DRAWINGS

FIGS. 7A-M illustrate perspective views of example IC structures formed when carrying out the method of FIGS. 1A-B, in accordance with some embodiments of the present disclosure.

Figure 1A:
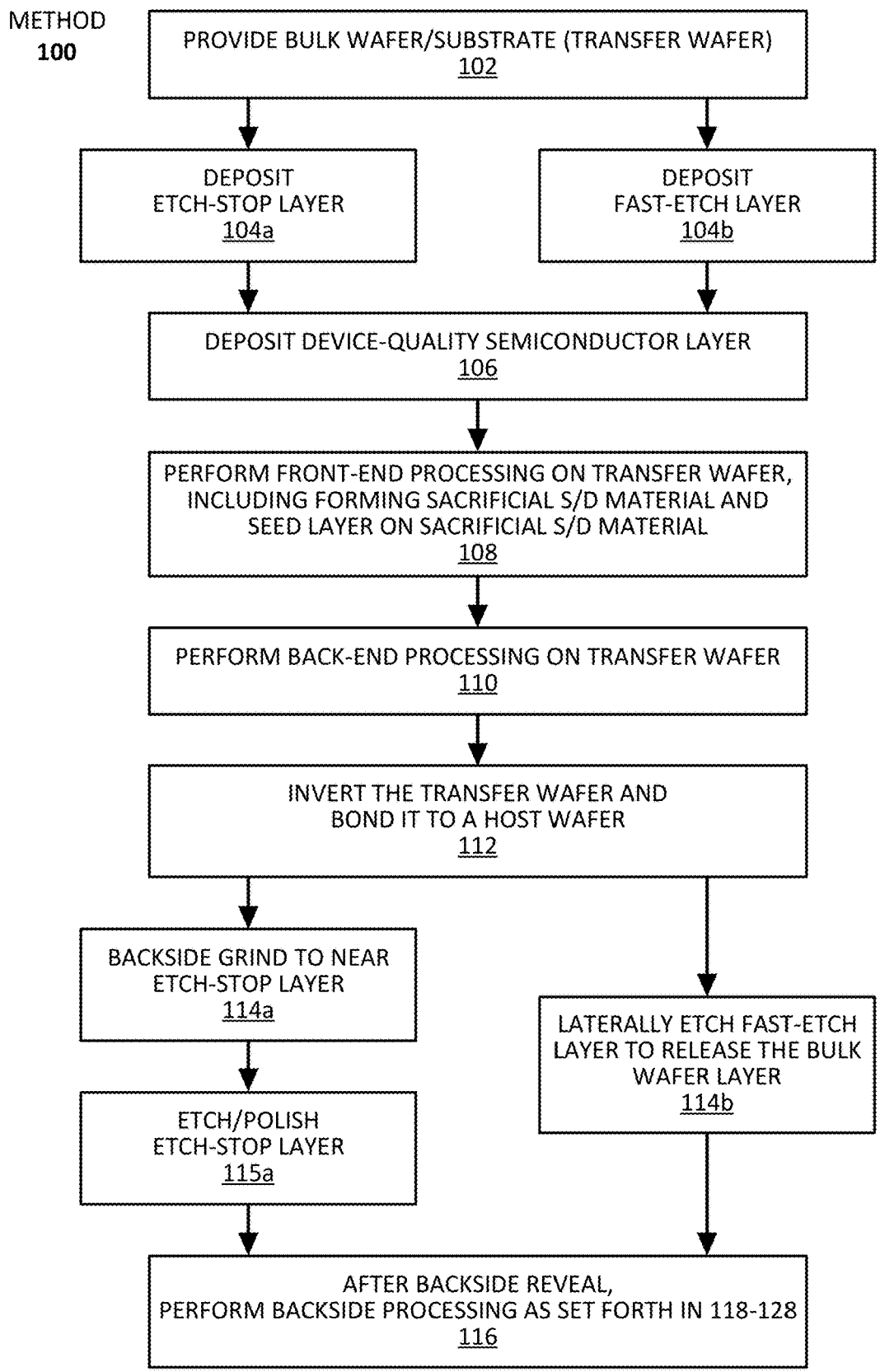
FIGS. 1A-B illustrates a method 100 of forming an integrated circuit (IC) including a metallization on both sides (MOBS) scheme and including backside source/drain (S/D) replacement material, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is primarily provided to assist in visually differentiating the different features. In short, the figures are provided merely to show example structures.

DETAILED DESCRIPTION

Metallization on both sides (MOBS) is a concept in integrated circuit (IC) fabrication where front-end or FEOL IC processing is done per state of the art (albeit, with some of the contacts potentially processed very deep), followed by a back-end or BEOL IC process flow. The wafer, referred to as a transfer wafer, is then flipped or inverted and bonded to a new support wafer, which is referred to as a host wafer. The backside of the transfer wafer can then be removed via some combination of grind, etch, and/or chemical mechanical polishing/planarization (CMP), with or without the use of an etch stop layer (e.g., a crystalline or amorphous insulator like silicon on insulator (SOI), for example). Such a substrate removal process is referred to as a backside reveal, as it reveals the backside or underside of the device layer, which may include one or more semiconductor devices (e.g., transistors), formed during front-end processing on the transfer wafer, thereby allowing subsequent processing to be performed from the backside of the device layer. The subsequent processing can include forming additional contact trenches in the revealed backside and depositing metal contacts in the backside contact trenches. Additional processing may include one or more layers of backside-back-end processing (e.g., forming one or more backside metallization layers, forming solder bumps, and so forth).

As a practical matter, a transistor has ohmic contacts that ideally include relatively high doping levels and composition in the source/drain (S/D) regions to reduce or eliminate parasitic external resistance that degrades transistor performance. However, thermal requirements associated with gate processing can be incompatible with such relatively high doping levels in the S/D regions, as the S/D dopant tends to diffuse into the channel region during the subsequent relatively high-temperature gate processing or other front-end processing. By performing a sacrificial deposition with low/no doping, the processing conserves the space and interface cleanliness while avoiding the inevitable diffusion associated with FEOL processing.

Thus, and in accordance with one or more embodiments of the present disclosure, techniques are disclosed for backside source/drain (S/D) replacement for semiconductor transistor structures with metallization on both sides (MOBS). In some embodiments, the techniques described herein can be used to recover low contact resistance in S/D regions including backside contacts, thereby reducing or eliminating parasitic external resistance that degrades transistor performance. In some embodiments, the techniques include a MOBS scheme that includes forming a sacrificial material in one or more S/D regions during front-end processing of a device layer on a transfer wafer. In some such embodiments, after bonding the transfer wafer to a host wafer and performing backside reveal for the device layer (as will be described in more detail herein), the sacrificial S/D material can be removed through backside contact trenches and replaced with final or functional S/D material having relatively high doping levels to provide desired ohmic contact properties. In some embodiments, during the front-end processing of the S/D regions, a seed layer may be formed on the sacrificial S/D material to assist with the subsequent structure inversion and backside removal of the sacrificial S/D material and regrowth of the final S/D material, as will be apparent in light of this disclosure. In some such embodiments, the seed layer may have an etch rate that is relatively lower than the sacrificial S/D material using a given etchant (e.g., at least 2, 3, 4, 5, 10, 15, 20, 25, or 50 times lower), such that the sacrificial S/D material can be effectively removed while leaving at least a portion of the seed layer from which the replacement final S/D material can be grown. In this sense, the seed layer can also act as an etch stop for the sacrificial S/D material etch process. Further, in some such embodiments, the relative etch rate may be achieved based on the seed layer at least one of: being undoped or nominally doped (e.g., doping concentration of less than 1E18 or 1E19 atoms per cubic cm); having a different material composition than the sacrificial S/D material (e.g., seed layer is Si or SiGe with 10% less Ge relative to the sacrificial S/D material); and including carbon alloying (e.g., at least 1% C), as will be apparent in light of this disclosure.

As previously described, the backside S/D replacement techniques provided herein are implemented within the context of a MOBS scheme. In some such embodiments, the MOBS scheme may be achieved by forming a multilayered substrate including a bulk wafer (e.g., a bulk silicon) or a semiconductor-on-insulator wafer (e.g., silicon-on-insulator or SOI wafer), an etch-stop and/or fast-etch layer deposited on the wafer, and a device-quality layer deposited on the etch-stop or fast-etch layer. Standard front-end processing can then be performed on the multilayered substrate to form as many semiconductor devices (e.g., transistors) as desired in the device-quality layer to create a device layer. Standard back-end processing can then be performed over that device layer to form contacts and as many metal (or otherwise electrically conductive) back-end layers as desired. In some embodiments, frontside vias or contacts may be processed very deep, such as into at least a portion of the multilayered substrate below the device layer, as the deeply processed vias may be used for making contact through the device layer from the backside, for example. The resulting fully integrated wafer, referred to herein as a transfer wafer, can then be bonded to another wafer, referred to herein as a host wafer, that may include one or more metallization layers and may also optionally be fully integrated with one or more semiconductor devices, for example. The bonding may occur by turning the transfer wafer upside down to invert it and then connecting the metal back-end and/or insulator material (e.g., oxide material) of the transfer wafer to the metal back-end and/or insulator material on the host wafer, such that the blank or otherwise unpopulated sides of the two sandwiched wafers are facing outward. Such bonding can be performed using heat, pressure, and/or force, in presence of a controlled environment such as a forming gas or ammonia, for example. In some embodiments, the host wafer may be a mechanical support and have no active electronic function, as it may be removed in a final product. Accordingly, the host wafer may include a non-semiconductor material, such as silicon oxide or silicon nitride or other refractory (e.g., alumina or yittria), to provide a few examples. In another embodiment, the host wafer may be a graphite disc with silicon carbide coating for resistance to chemical attack, for example.

After the transfer wafer is bonded to the host wafer, the bulk wafer portion of the transfer wafer (e.g., the majority of the multilayer substrate thickness that is not populated with active device elements) can be removed from the multilayer substrate in what is referred to as a backside reveal process. In embodiments including an etch-stop layer in the multilayer substrate, a backside grind can be performed to get close to the etch-stop layer and then a wet etch and/or polish process can be performed until the etch/polish is effectively stopped at the etch-stop layer. In some such embodiments, only the device layer (including transistors formed thereon/therefrom) and possibly some of the etch-stop layer will remain on the transfer wafer, thereby enabling vertical integration MOBS schemes. In other embodiments including a fast-etch layer in the multilayer substrate, a lateral wet etch can be performed to remove the fast-etch layer and allow for the release (liftoff process, rather than a grind process) of the bulk wafer from the device-quality layer. In some such embodiments, only the device layer (including transistors formed thereon/therefrom) and possibly some of the fast-etch layer will remain on the host wafer, significantly reducing the thickness of the transfer wafer, thereby enabling vertical integration MOBS schemes. In still other embodiments, the multilayer substrate may include both a fast-etch and an etch-stop layer, as will be apparent in light of this disclosure. In some such embodiments, the lateral etch can be performed to release the bulk wafer and then a backside etch and/or polish can be performed until the etch/polish is effectively stopped at the etch-stop layer.

Note that "device-quality" and "device layer" as used herein (e.g., device-quality layer or device-quality material) denotes the inclusion of high-quality single-crystal semiconductor material. The high-quality component may be representative of defect levels (e.g., less than 1E8 defects per square cm), contamination levels, dopant levels, roughness, and/or any other suitable or desired property of the material, as will be apparent in light of the present disclosure. The device quality layer may contain regions of graded or step-function concentration gradient to provide regions of either high or low etch and/or polish rates to facilitate the backside reveal process, as can be understood based on this disclosure. As will be further apparent, a MOBS scheme cannot be achieved without using the integration techniques variously described herein. This is because the device-quality material from which one or more transistors are formed on the transfer wafer needs to have a single-crystal structure of sufficiently high-quality from the standpoint of contamination, doping, defect, roughness, etc. Without having the crystal structure defined by a bulk wafer (e.g., the transfer wafers described herein), such high-quality single-crystal material would not otherwise be achievable and thus the device-quality layer for vertically integrated transistor levels would not be achievable. Therefore, the backside S/D replacement techniques described herein can first make use of the transfer-to-host wafer integration techniques described herein, as will be apparent in light of this disclosure. Note that, after the transfer-to-host wafer integration scheme is used to form a MOBS structure, portions below the device layer (originally formed on the transfer wafer) may generally be referred to as the frontside of the device layer, while portions above the device layer may generally be referred to as the backside of the device layer.

Further note that the frontside of the device layer may be subjected to both so-called front-end and back-end processing, as such processing can be performed prior to the transfer-to-host wafer bonding. After the transfer-to-host wafer integration and backside reveal has been performed, the backside may be subjected to what would be considered back-end processing, but as such back-end processing is being performed on the backside of the device layer, it may be referred to as so called backside-back-end (BBE) processing herein. In addition, note that frontside and backside designations are relative to a given orientation of the device layer, which changes during the transfer-to-host wafer integration scheme, as the device layer is inverted. Further note that when the semiconductor structure is inverted, such that the device layer is effectively pointing down, the channels of the transistor devices in that device layer are, relatively speaking, above their respective gates, rather than below the gates as typically depicted. To this end, and as will be appreciated, reference to "above" or "below" herein is not intended to necessarily implicate a limitation as to orientation of the structure. Rather, such terminology is simply used as relative terms to describe the structure as it exists in one particular orientation. In reality, the structure can be turned and inverted and otherwise oriented as desired for a given application, and the relative terminology used herein can simply be adjusted to that actual orientation.

Numerous benefits of the transfer-to-host wafer integration techniques variously described herein will be apparent in light of this disclosure. For example, the techniques can be used to cleanly produce a transistor and back-end stack on a very thin device-quality substrate, such as a substrate having a thickness of less than 400, 250, 100, or 50 nm, or some other suitable maximum thickness as will be apparent in light of this disclosure. As previously described, such a thin substrate would have to be of device level quality for integration purposes with respect to contamination, doping levels, defect levels (e.g., point, line, and bulk defect levels), roughness, and wafer bow, just to name a few example areas. Use of the etch-stop and/or fast-etch layers in the integration techniques as described herein provides built-in self-alignment capabilities such that every wafer can be more easily made to the desired specifications, including the ability to achieve device level quality substrates and enable vertical scaling (e.g., for a MOBS scheme and/or for multiple layers of front-end devices, if so desired). In addition, the transfer-to-host wafer integration techniques variously described herein provide benefits over mere grinding and etching techniques, as such techniques do not include a built-in etch stop layer or fast etch layer, resulting in thickness uniformity problems that can affect performance and reliability. The integration techniques described herein demonstrate control over the thickness of the substrate of the stacked layer and also allow for very thin device-quality layers to be vertically stacked. In addition, the integration techniques described herein enable a MOBS scheme, which can include the backside S/D replacement techniques described herein. Such backside contact resistance reduction techniques can provide improved or enhanced ohmic contact properties, as will be apparent in light of this disclosure.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography;

or high resolution physical or chemical analysis, to name a few suitable example analytical tools. In particular, in some embodiments, such tools may indicate an IC MOBS structure including S/D regions of one or more transistors that were replaced (at least in part) via backside processing. For instance, in some such embodiments, the techniques can be detected through the presence of a seed layer below the S/D regions, where the seed layer includes semiconductor material and has compositional features including at least one of the following: incorporation of an etch-rate reducing element, such as carbon and/or low or no doping; carbon levels of 1% or greater and/or doping levels of at least 1E19 or 1E20 atoms per cubic centimeter (cm) less than doping levels of the S/D regions. In such cases, the seed layer is present to assist with growing the final S/D material after the backside removal of the sacrificial S/D material that was present in that location as a sort of place holder for the S/D regions. Further, this allows for the final S/D material to include relatively high impurity doping amounts (e.g., greater than 1E20, 5E20, or 1E21 atoms per cubic cm) without having such dopants diffuse into the adjacent channel region, as the final S/D material is formed in the S/D regions after processing that would have cause such undesired dopant diffusion. In some embodiments, the seed layer may be undoped or include impurity doping levels (e.g., of a suitable n-type or p-type dopant) of less than 1E18, 1E19, or 1E20 atoms per cubic cm, for example, while the S/D regions (after the sacrificial material has been removed and replaced with final material) may include impurity doping levels (e.g., of a suitable n-type or p-type dopant) of greater than 1E19, 1E20, or 1E21 atoms per cubic cm, for example. In some embodiments, the MOBS scheme may be detected based on one or more metallization layers being below and above the device layer (which can include one or more transistors) and/or based on one or more transistors being included on the IC in a relatively inverted fashion (e.g., where each transistor channel is above the gate, which is atypical in conventional structures). Numerous configurations and variations will be apparent in light of this disclosure.

Architecture and Methodology

Figure 1B:
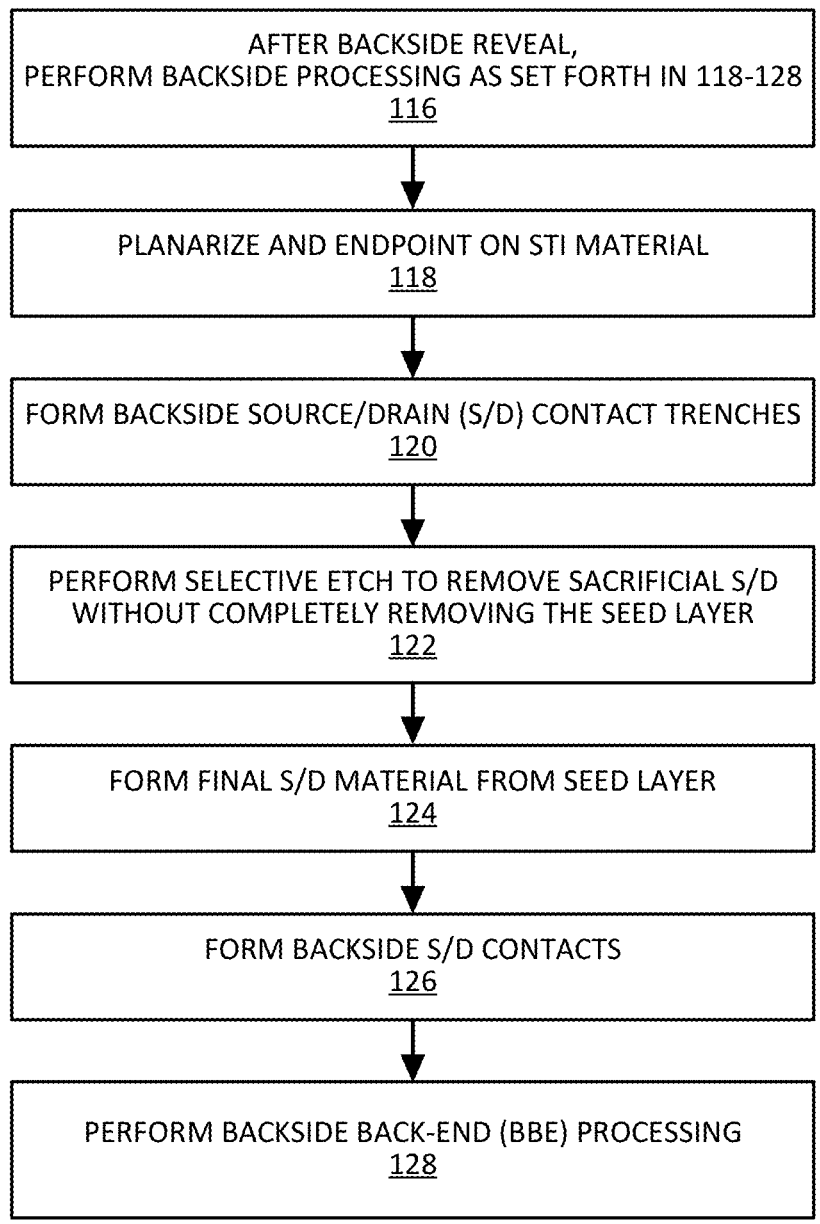

FIGS. 1A-B illustrates a method 100 of forming an integrated circuit (IC) including a metallization on both sides (MOBS) scheme and including backside source/drain (S/D) replacement material, in accordance with some embodiments of the present disclosure. FIGS. 2A-D, 3, 4-4', 5A-B, and 6A-E illustrate example integrated circuit structures that are formed when carrying out the method 100 of FIGS. 1A-B, in accordance with some embodiments of the present disclosure. The IC structures are primarily depicted using transistor devices including a finned configuration (e.g., FinFET or tri-gate) for ease of illustration. However, the techniques can be used to integrate transistors of any suitable geometry, depending on the end use or target application. Various example transistor device geometries that can benefit from the integration and backside S/D replacement techniques described herein include, but are not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), and nanowire (or nanoribbon or gate-all-around) transistor configurations. In addition, the techniques may be used for p-type transistor devices (e.g., p-MOS or p-TFET) and/or n-type transistor devices (e.g., n-MOS or n-TFET). Further, the techniques may be used for complementary transistor-based devices, such as complementary MOS (CMOS) or complementary TFET (CTFET) devices, or few to single electron quantum transistor devices, for example. Further still, such devices may employ semiconductor materials that are three dimensional crystals as well as two dimensional crystals or nanotubes, for example. In some embodiments, the techniques may be used to benefit devices of varying scales, such as IC devices having critical dimensions in the micrometer range and/or in the nanometer range (e.g., formed at the 22, 14, 10, 7, 5, or 3 nm process nodes, or beyond).

Figure 2A:
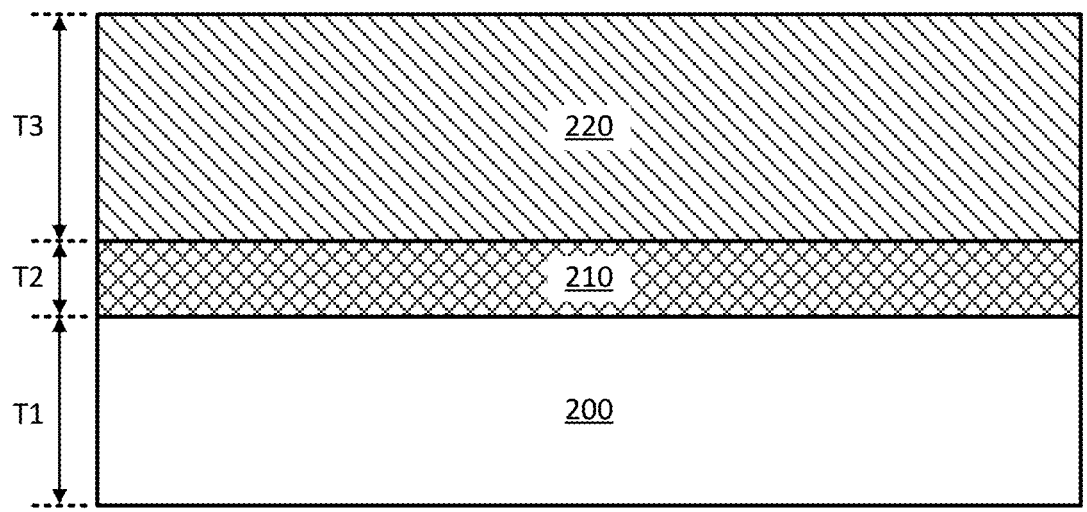
FIGS. 2A-D illustrate forming at least one transistor including sacrificial S/D material on a multilayer substrate including a bulk wafer, a sacrificial layer, and a device-quality layer, in accordance with some embodiments of the present disclosure. Note that FIG. 2A' illustrates another example multilayer substrate, in accordance with an embodiment of the present disclosure.
Figure 2A:
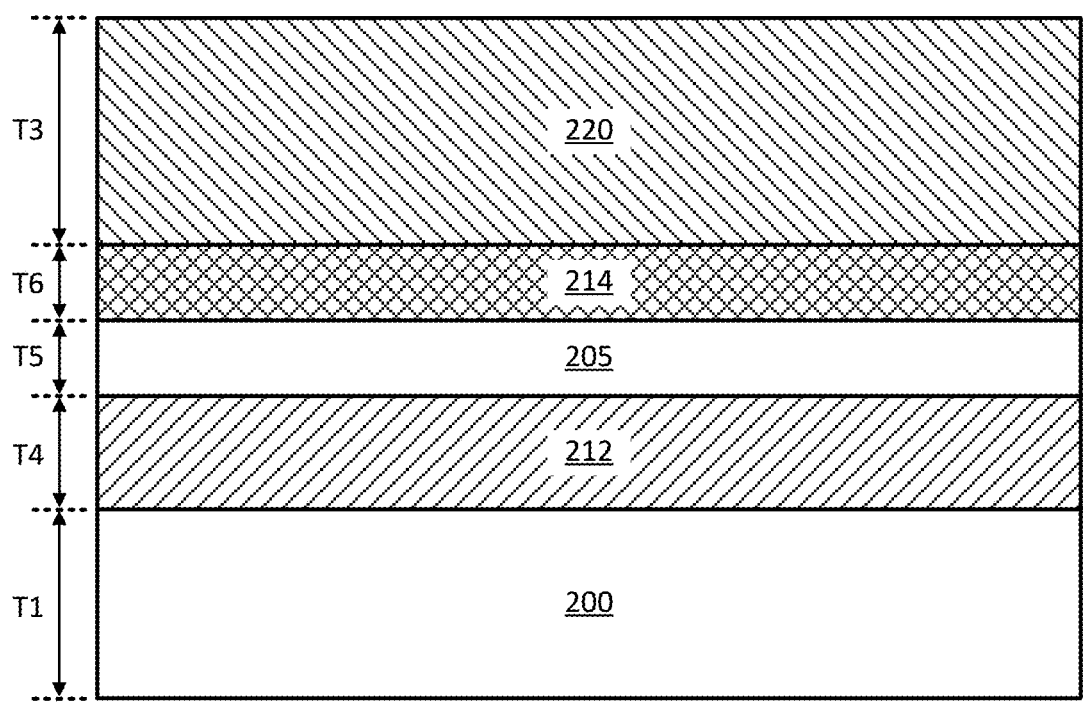

As can be seen in FIG. 1A, method 100 includes providing 102 a bulk wafer or substrate, depositing 104a an etch-stop layer or depositing 104b a fast-etch layer, and depositing a device-quality semiconductor layer 106 to form an example multilayer substrate illustrated in FIG. 2A, in accordance with an embodiment. The multilayer substrate, in this example embodiment, includes bulk wafer layer 200, etch-stop or fast-etch layer 210 and device-quality semiconductor layer 220. In some embodiments, bulk wafer layer 200 may be: a bulk substrate including group IV material, such as silicon (Si), germanium (Ge), silicon germanium (SiGe), or silicon carbide (SiC), and/or at least one group III-V material and/or sapphire and/or any other suitable material(s) as will be apparent in light of this disclosure; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group IV material as used herein includes at least one group IV element (e.g., carbon, silicon, germanium, tin), such as Si, Ge, SiGe, or SiC compounds or alloys, to name some examples. Note that group III-V material as used herein includes at least one group III element (e.g., aluminum, gallium, indium, boron, thallium) and at least one group V element (e.g., nitrogen, phosphorus, arsenic, antimony, bismuth), such as gallium arsenide (GaAs), gallium nitride (GaN), indium gallium arsenide (InGaAs), indium gallium nitride (InGaN), aluminum gallium arsenide (AlGaAs), aluminum gallium nitride (AlGaN), and indium phosphide (InP), to name some examples. In some embodiments, bulk wafer 200 may be doped with one or more materials, such as including p-type or n-type impurity doping of any suitable concentration, for example. In some embodiments, bulk wafer 200 may include a surface crystalline orientation described by a Miller Index of <100>, <110>, or <111>, or its equivalents, as will be apparent in light of this disclosure. As the devices formed on bulk wafer 200 are to be integrated to another host wafer, bulk wafer 200 may be referred to herein as a transfer wafer, for ease of reference. In addition, for ease of description, the present disclosure will be described primarily in the context of bulk wafer 200 being a bulk Si or SOI wafer. In some cases, the thickness T1 of bulk wafer layer 200 may be, for example, 0.1-2 mm, such as 0.75 mm for 12 inch diameter wafers, as is standard. However, the thickness T1 of bulk wafer layer 200 may be any suitable thickness, as will be apparent in light of this disclosure.

In this example embodiment, layer 210 may either be an etch-stop layer or a fast-etch layer that has been deposited 104a or 104b on the bulk wafer layer 200. As will be apparent in light of the present disclosure, layer 210 is a sacrificial layer that assists with the removal of bulk wafer layer 200. Accordingly, as is described in more detail herein, sacrificial layer 210 is either completely or partially removed during performance of the integration techniques. Deposition 104a or 104b may include a blanket deposition of sacrificial layer 210 or a selective growth of sacrificial layer 210 on layer 200 using chemical vapor deposition (CVD), atomic layer deposition (ALD), molecular beam epitaxy (MBE), and/or any other suitable process, depending on the end use or target application. In some embodiments, the top surface of wafer layer 200 may be treated (e.g., chemical treatment, thermal treatment, etc.) prior to deposition of sacrificial layer 210. In some embodiments, where sacrificial layer 210 is an etch-stop layer, the thickness T2 of the etch-stop layer 210 may be in the range of 50-200 nm, for example, or any suitable thickness that allows etch/polish 115a hitting the valleys caused by backside grind 114a to withstand the etch/polish 115a process until all peaks (made as a result of the backside grind) are consumed, as will be described in more detail with reference to FIG. 5A. In some embodiments, where sacrificial layer 210 is a fast-etch layer, the thickness T2 of the fast-etch layer 210 may be at least 500 nm, for example, or any suitable thickness that allows lateral etch 114b to etch in from the edges of the wafer 200 and allow a liftoff or removal of the wafer, as will be described in more detail with reference to FIG. 5B. However, the thickness T2 of sacrificial layer 210 may be any suitable thickness, as will be apparent in light of this disclosure.

In this example embodiment, device-quality layer 220 may include group IV semiconductor material (e.g., Si, Ge, SiGe), group III-V semiconductor material (e.g., GaAs, InGaAs, InP), graphene, $MoS_2$, and/or carbon nanotubes, to name a few examples. In some embodiments, layer 220 may include a plurality of multilayer materials, which may be used for nanowire transistor configuration applications, for example. In addition, layer 220 may be doped with one or more other materials (e.g., with suitable n-type and/or p-type dopants), depending on the end use or target application. Deposition 106 of layer 220 can be performed using any deposition process described herein (e.g., CVD, ALD, MBE, etc.) or any other suitable deposition process. In some embodiments, the thickness T3 of device-quality layer 220 may be in the range of 300-500 nm, for example, or any other suitable thickness as will be apparent in light of this disclosure. As can be understood based on this disclosure, one or more transistor devices can be formed using device-quality layer 220, and those devices will be bonded to a host wafer to allow for a MOBS scheme, as will be described in more detail herein.

Any suitable material may be used for sacrificial layer 210, depending on the selected configuration. In some embodiments, the material selected for sacrificial layer 210 may be based on whether layer 210 is an etch-stop layer or a fast-etch layer, the material of bulk wafer layer 200, and/or the material of device-quality layer 220. For instance, in the case of a Si bulk wafer 200 and an Si device-quality layer 220, an example etch-stop material includes Si:C with C doping or alloying content in the range of 1-30% and example fast-etch materials include SiGe and SiGe:B. In the case of a Si bulk wafer 200 and a Ge or SiGe with greater than 80% Ge content device-quality layer 220, for layer 210, example etch-stop materials include Ge or Ge:C with C doping content in the range of 1-30% and example fast-etch materials include GeSn and GeSn:B. In the case of a Si bulk wafer 200 and a SiGe with Ge content in the range of 10-80% device-quality layer 220, for layer 210, an example etch-stop material includes SiGe:C with C doping content in the range of 1-30% and an example fast-etch material includes SiGe with approximately 10% or more higher Ge content than the SiGe device-quality layer (which may or may not be boron doped). In the case of a Si bulk wafer 200 and an InGaAs device-quality layer 220, for layer 210, an example etch-stop material includes InP and an example fast-etch material includes GaAs. In embodiments including a fast-etch layer, the fast-etch material may be selected based on the ability to remove that fast-etch material at a rate of at least 2, 5, 10, 20, 50, 100, or 200 times faster than the material of one or more of the surrounding layers. Numerous variations on the materials of sacrificial layer 210, whether the layer is an etch-stop layer or a fast-etch layer, will be apparent in light of the present disclosure.

FIG. 2A' illustrates another example multilayer substrate, in accordance with an embodiment. In this example embodiment, bulk wafer 200 and device-quality layer 220 are the same as described with reference to the example structure of FIG. 2A, but additional layers are included between them. As can be seen in method 100 of FIG. 1A, some embodiments include both an etch-stop layer and a fast-etch layer, which is the case in the example structure of FIG. 2A', where layer 212 is a fast-etch layer and layer 214 is an etch-stop layer. The previous relevant discussion with respect to layer 210 is equally applicable to this structure. For example, the relevant thicknesses and materials discussed with reference to layer 210 as a fast-etch layer apply to fast-etch layer 212 (having a thickness T4). Further, the relevant thicknesses and materials discussed with reference to layer 210 as an etch-stop layer apply to etch-stop layer 214 (having a thickness T6). As can also be seen in FIG. 2A', layer 205 is sandwiched between fast-etch layer 212 and etch-stop layer 214. Layer 205 may be included as a transitional layer that assists with the etch and removal of layer 212 and/or assists with the etch/polish performed to etch-stop layer 214, as will be apparent in light of the present disclosure. In some embodiments, layer 205 may include the same material as bulk wafer 200 or layer 205 may include the same material of layer 220, for example. Further, in some embodiments, layer 205 may have a thickness T5 in the range of 50-300 nm, for example, or any other suitable thickness depending on the end use or target application. Note that the deposition of any of layers 212, 205, 214, and 220 can be performed using any deposition process described herein (e.g., CVD, ALD, MBE, etc.) or any other suitable deposition process.

Figure 2B:
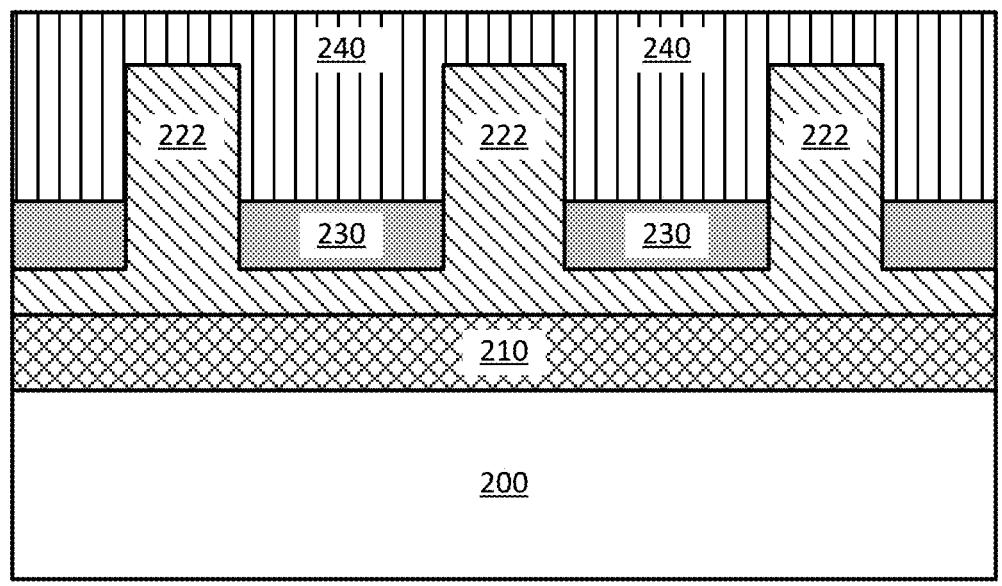

Method 100 of FIG. 1A continues with performing 108 front-end processing using the example multilayer substrate of FIG. 2A to form the resulting example structure shown in FIG. 2B, in accordance with an embodiment. The front-end processing, in this example embodiment, includes forming sacrificial S/D material to be later removed and replaced during backside processing, as will be apparent in light of this disclosure. As can be seen in FIG. 2B, during front-end processing 108, the device-quality layer 220 was formed into fins 222, shallow trench isolation (STI) material 230 was deposited and recessed, and gate 240 was formed on fins 222 to define channel regions (where source/drain (S/D) regions are adjacent to the channel regions). The formation of fins 222 may have been performed using any suitable processes, such as a wet or dry etch process. Fins 222 may be formed to have varying widths and heights. For example, the height (dimension in the Y direction) to width (dimension in the X direction) ratio (h/w) of the fins may be greater than 1, such as 1.5 to 3, in some instances. Note that fins 222 and the trenches formed between the fins 222 are shown as having the same width and depth/height in this example structure for ease of illustration; however, the present disclosure is not intended to be so limited. Also note that although three fins 222 are shown in the example structure, any number of fins may be formed, such as one, two, ten, hundreds, thousands, millions, etc., depending on the end use or target application. Further note that although a portion of the device-quality layer 220 was formed into fins 222, the maximum thickness of the layer is still the same as (or approximately the same as) the original thickness of the deposited layer 220 shown in FIG. 2A (where the thickness may be measured from the bottom of layer 220 to the top of fins 222).

In the example structure of FIG. 2B, STI material 230 is present between fins 222 formed from device-quality layer 220. In some embodiments, deposition of the STI material 230 may include any deposition process described herein (e.g., CVD, ALD, MBE, etc.), or any other suitable deposition process. STI material 230 may include any suitable insulating material, such as one or more dielectric, oxide (e.g., silicon dioxide), or nitride (e.g., silicon nitride) materials. In some embodiments, the STI material 230 may selected based on the material of fins 222. For example, in the case of a Si device-quality layer 220, STI material 220 may be silicon dioxide or silicon nitride. As can also be seen in the structure of FIG. 2B, a gate 240 was formed on fins 222. In some embodiments, the formation of gate 240 may include a gate first flow (also called up-front hi-k gate). In some embodiments, the gate may be formed in a gate last flow (also called replacement metal gate (RMG)). In such gate last processing, the process includes dummy gate oxide deposition, dummy gate electrode (e.g., poly-Si) deposition, and patterning hardmask deposition. Additional processing may include patterning the dummy gates and depositing/ etching spacer material. Following such processes, the method may continue with insulator deposition, planarization, and then dummy gate electrode and gate oxide removal to expose the channel region of the transistors. Following opening the channel region, the dummy gate oxide and electrode may be replaced with, for example, a hi-k dielectric and a replacement metal gate, respectively.

In this example embodiment, the gate includes a gate electrode 240 and a gate dielectric (not shown for ease of illustration) formed directly under the gate electrode 240. The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. The gate electrode 240 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Spacers may be formed adjacent to the gate and/or hardmask may be formed on the gate to, for example, assist with replacement gate processing and/or protect the gate during subsequent processing.

Figure 2C:
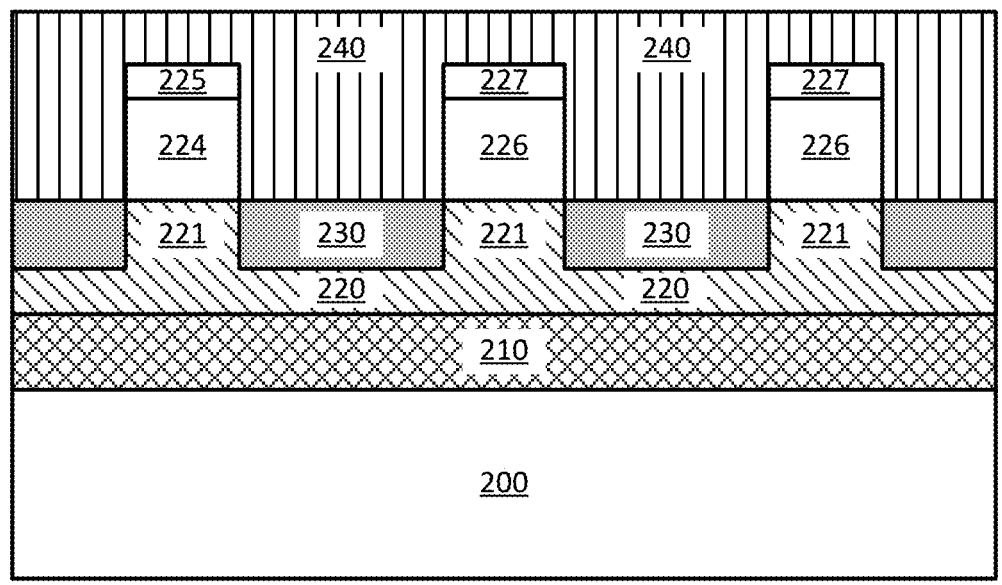
Figure 2C:
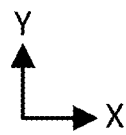

Front-end processing 108, in this example embodiment, continues with source/drain (S/D) processing, which includes removing at least a portion of fins 222 and replacing that portion with replacement material 224 and 226 in the S/D regions, to form the example resulting structure of FIG. 2C. As will be apparent in light of this disclosure, S/D material 224 is intended to be the final material for the corresponding S/D regions, as they will be contacted from the frontside of the structure. As will also be apparent in light of this disclosure, S/D material 226 is intended to be sacrificial material for the corresponding S/D regions, as that sacrificial material 226 will be removed and replaced after backside reveal, as those S/D regions will be contacted from the backside of the structure. As can be understood based on FIG. 2C, the S/D regions of fins 222 that was above the STI layer 230 were removed and replaced, in this example embodiment, to form replacement S/D regions 224 and 226. As a result, in the S/D region cross-section shown in FIG. 2C, only the sub-fin portions 221 of the original fins 222 remains. In some embodiments, replacement S/D regions 224 (which are replacement fins, in this example embodiment), may be formed with any suitable size and shape, such as a size and shape similar to the portion of the original fins 222 that exuded above STI material regions 230, for example. However, in some embodiments, the replacement fin portions may have different sizes and shapes, such as is shown in FIGS. 7G-N. In some embodiments, any suitable techniques may be used to remove and replace the S/D regions, such as using masking, etching, and/or deposition processes, as can be understood based on this disclosure.

In some embodiments, replacement final S/D 224 (to be contacted from the frontside) may include any suitable material, such as any suitable semiconductor material (e.g., group IV or group III-V semiconductor material). Further, in some embodiments, the replacement S/D material 224 may or may not include any suitable n-type and/or p-type dopants, for example. As is also shown in FIG. 2C, the S/D regions to be contacted from the frontside (indicated as 224) include optional frontside contact resistance reduction layer 225, in this example embodiment. In some embodiments, such a contact resistance reduction layer 225 may be formed on the frontside portion of the S/D regions to assist with ohmic contact, for example. In some embodiments, the frontside contact resistance reduction layer 225 may include any suitable material, such as group IV and/or group III-V material, or any other suitable material as will be apparent in light of this disclosure. In some embodiments, where frontside contact resistance reduction layer 225 is present, it may include degenerately doped material, such as including n-type and/or p-type dopant concentrations of at least 1E19, 1E20, 5E20, or 1E21 atoms per cubic cm, or some other suitable minimum threshold dopant concentration to assist with ohmic contact. In some embodiments, frontside contact resistance reduction layer 225 may include similar material as its respective S/D region 224. In some such embodiments, the material composition of the frontside contact resistance reduction layer or portion 225, relative to the S/D region(s) 224 for which the frontside contact resistance reduction layer or portion 225 is used, may be different than the material composition of that S/D region(s) 224. For instance, in the example case of a SiGe S/D region, a frontside contact resistance reduction layer or portion for that SiGe S/D region may also include SiGe, but with a relatively increased percentage of Ge in the SiGe material. Further, in the example case of an InGaAs S/D region, a frontside contact resistance reduction layer or portion for that InGaAs S/D region may also include InGaAs, but with a relatively increased percentage of In in the InGaAs material.

To provide more specific examples, for illustrative purposes, in an embodiment including an Si channel p-MOS having SiGe:B S/D regions with 3E20 B atoms per cubic cm, a frontside contact resistance reduction layer or portion for the S/D regions may include SiGe:B with 5E20 B atoms per cubic cm or Ge:B with 5E20 B atoms per cubic cm, for instance. In another example case, in an embodiment including an Si channel n-MOS having Si:P S/D regions with 5E20 P atoms per cubic cm, a frontside contact resistance reduction layer or portion for the S/D regions may include Si:P with 1E21 P atoms per cubic cm. Note that in some embodiments, frontside contact resistance reduction layer 225, where present, may be a distinct layer or may be a portion of the S/D regions 224 where one or more materials or material concentrations are graded (e.g., increased and/or decreased) from an S/D region 224 to the frontside contact resistance reduction portion 225, for example. For instance, when forming S/D regions 224, the final portion of the deposition process may include increasing the doping concentration in a steady or sudden manner. In some embodiments, frontside contact resistance reduction layer 225 may include a doping concentration (e.g., of any suitable n-type or p-type dopants) that is at least 1E17 to 1E21 atoms per cubic cm (e.g., at least 1E20 atoms per cubic cm) greater than the dopant concentration of the S/D regions 224 for which it is providing contact resistance reduction, or some other suitable relative amount as will be apparent in light of this disclosure.

Continuing with the example structure of FIG. 2C, the sacrificial S/D regions 226 can include any suitable material, such as group IV or group III-V semiconductor material, for example. In some embodiments, the material of sacrificial S/D regions 226 may or may not include impurity dopants (e.g., any suitable n-type or p-type dopants), where such dopants may have a concentration of less than 1E20, 1E19, or 1E18 atoms per cubic cm, or some other suitable amount as will be apparent in light of this disclosure. In embodiments where the sacrificial S/D regions 226 include impurity dopants, the doping concentration may be kept relatively low (e.g., less than 1E20 atoms per cubic cm) to prevent the dopants from diffusing into the channel region during subsequent processing (e.g., during high temperature anneal processes that occur during front-end processing). In an example embodiment, the sacrificial S/D material may include undoped or low doped (e.g., less than 1E20 atoms per cubic cm) SiGe material, for instance. In some embodiments, all of the S/D regions may be replaced with such sacrificial material to be later removed and replaced during backside processing. In some embodiments, only some of the S/D regions may be replaced with such sacrificial material to be later removed and replaced during backside processing. In some such embodiments, the selective S/D regions including sacrificial material may include only the S/D regions of one polarity (e.g., only one of n-type or p-type S/D regions for only one of n-MOS or p-MOS transistors, respectively) of transistors to be formed on the transfer wafer. In some such embodiments, the selective S/D regions including sacrificial material may include only the S/D regions to be contacted from the backside (after performing the backside reveal process described herein), as opposed to those to be contacted from the frontside. In the specific embodiment of FIG. 2C, S/D regions 224 include final S/D material, as those regions are to be contacted from the frontside, while S/D regions 226 include sacrificial S/D material, as those regions are to be later removed and replaced after the backside reveal process.

As shown in FIG. 2C, the sacrificial S/D regions 226 each include a top layer 227, in this example embodiment. The top layer 227 may be referred to as a seed layer herein, because after the material of the sacrificial S/D regions 226 is removed during backside processing, the final replacement S/D material formed in those regions can then be grown from the seed layer 227, as will be apparent in light of this disclosure. In some such embodiments, the sacrificial S/D material 226 may be selectively removed such that the seed layer 227 remains after a selective etch process. Accordingly, in some embodiments, the seed layer 227 may have an etch rate that is less than that of the sacrificial S/D material 226 for a given etchant, such that the given etchant is capable of removing the sacrificial S/D material 226 at a rate of at least 2, 3, 4, 5, 10, 15, 20, 25, 30, 40, or 50 times faster than the rate at which the given etchant removes the seed layer material 227, or some other suitable minimum relative rate as can be understood based on this disclosure. In some embodiments, seed layer 227 may include semiconductor material, such as such as group IV or group III-V semiconductor material. In some such embodiments, the seed layer may or may not include alloying elements such as carbon at levels of 1 to 20% and/or impurity dopants (e.g., any suitable n-type or p-type dopants), where such dopants may have a concentration of less than 1E20, 1E19, or 1E18 atoms per cubic cm, or some other suitable amount as will be apparent in light of this disclosure. In embodiments where the seed layer 227 includes impurity dopants, such dopants may be present as a result of diffusion from the sacrificial S/D regions 226 (e.g., caused during high temperature anneal processes that occur during front-end processing). In embodiments where the seed layer 227 includes impurity dopants, the dopant concentration may be at least 1E17, 1E18, 1E19, or 5E19 atoms per cubic cm (or some other suitable threshold amount) less than the dopant concentration of sacrificial S/D material 226 to, for example, assist with the selective etch and removal of the sacrificial S/D material 226 relative to the seed layer material 227 during backside processing.

In some embodiments, the top/seed layer material 227 may include similar semiconductor material relative to its respective sacrificial S/D region material 226 (irrespective of any included impurity dopants in either/both of the features), while in other embodiments, the features may include different semiconductor material. For instance, in some embodiments, both a sacrificial S/D region 226 and its corresponding seed layer 227 (i.e., the seed layer on top of or above the sacrificial S/D region as shown in FIG. 2C) may both include the same semiconductor material (e.g., both include Si or SiGe) or they may include different semiconductor material (e.g., where a sacrificial S/D region 226 includes SiGe and the corresponding seed layer 227 includes Si). Even in embodiments where a sacrificial S/D region 226 and corresponding seed layer 227 pair include the same semiconductor material, the material of the different features may include different alloying concentrations. For example, where both features 226 and 227 include SiGe, and more specifically $Si_{1-x}Ge_x$, where x is the percentage of germanium in the alloy, the germanium concentration (or x value) of seed layer 227 may be at least 5, 10, 15, or 20 (or some other suitable threshold amount) less than the germanium concentration (or x value) of the corresponding sacrificial S/D region 226. For instance, in some such example cases, a sacrificial S/D region 226 may include SiGe having a germanium concentration of 20% and a corresponding seed layer 227 may include SiGe having a germanium concentration of 10% or less. Such a relative difference in Ge concentration may be used to assist with the backside selective etch for removing material of the sacrificial S/D region 226, which is described in more detail herein.

In some embodiments, seed layer material 227 may include a dilute alloy of carbon to assist with the backside selective etch process. For instance, in some such embodiments, the seed layer material 227 may include at least 0.5, 1, 1.5, 2, or 2.5% (or some other suitable threshold amount) carbon alloying to increase the etch selectivity of the seed layer 227 relative to the sacrificial S/D region material 226, for example. In some embodiments, where the seed layer material 227 includes dilute carbon alloying, such alloying may be in the range of 1 to 10% (e.g., 2% plus or minus 1%), or some other suitable amount or range as will be apparent in light of this disclosure. In some embodiments, the seed layer 227 may have a thickness (dimension in the Y direction) in the range of 0.5 to 20 nm (e.g., 2 to 10 nm), or any other suitable thickness or thickness range as will be apparent in light of this disclosure. Note that the seed layer of the middle and right fins shown in FIG. 2C include the same size, shape, and material in this example embodiment; however, the present disclosure is not intended to be so limited. For instance, in some embodiments, multiple different seed or seeding layers may be used, along with multiple different sacrificial S/D materials, as can be understood based on this disclosure.

Note that any additional or alternative suitable front-end processing 108 may be used and variations to the specific structure of FIG. 2C may be possible in other embodiments, as will be apparent in light of this disclosure. For example, in some embodiments, one or more of the fins 222 of the structure of FIG. 2B need not be removed and replaced by another semiconductor material, such that native fins are used in the end structure, for example. In another example embodiment, for transistor devices having a planar configuration, STI material 230 may not have been recessed to expose fins 222, resulting in the STI material 230 being level with the top of fins 222. Also note that front end-processing is also referred to as front-end-of-line (FEOL) and generally includes processes up to (but not including) the deposition of metal interconnect layers. As previously described, the front-end processing may include the formation of one or more transistor devices including any of the following: field-effect transistors (FETs), metal-oxide-semiconductor FETs (MOSFETs), tunnel-FETs (TFETs), planar configurations, dual-gate configurations, finned configurations (e.g., fin-FET, tri-gate), and/or nanowire (or nanoribbon or gate-all-around) configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). Numerous variations and configurations will be apparent in light of the present disclosure.

Figure 2D:
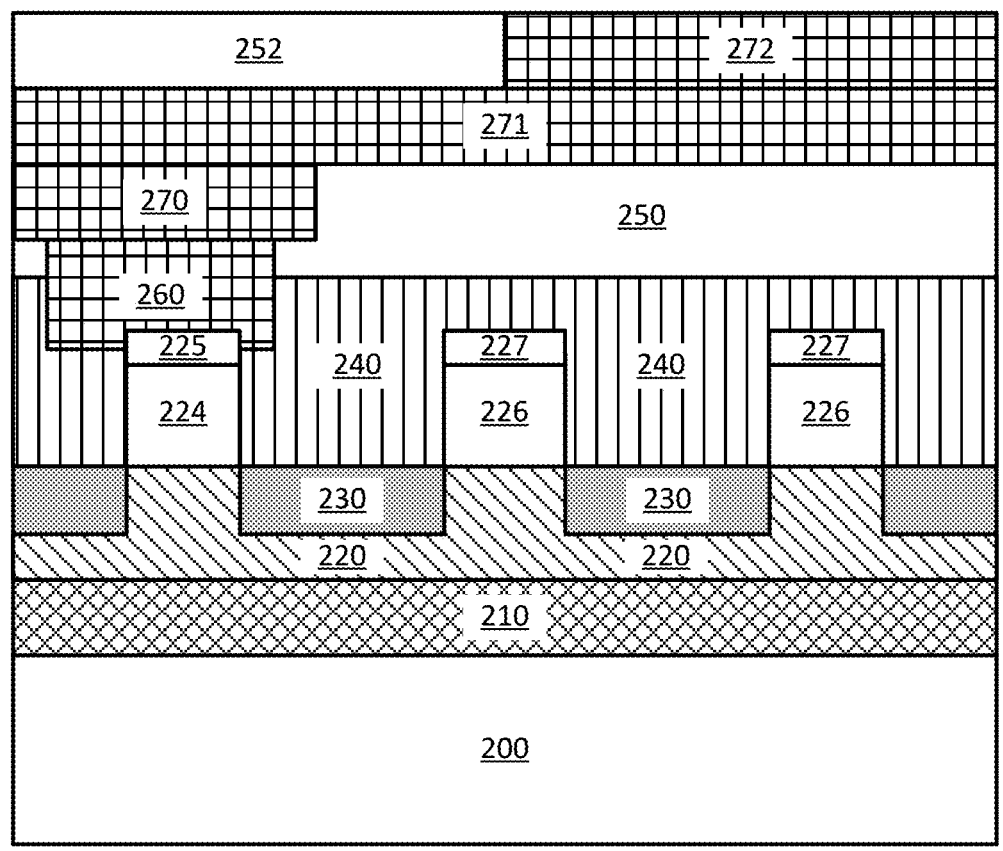

Method 100 of FIG. 1A continues with performing 110 back-end processing using the example structure of FIG. 2C to form the resulting example IC structure 20 (referred to herein as a transfer wafer) shown in FIG. 2D, in accordance with an embodiment. As can be understood based on this disclosure, such back-end processing 110 is still being performed on the frontside of the transfer wafer 20. In this example embodiment, the back-end processing 110 primarily includes the formation of: metal contacts 260; metal lines (and/or metal vias) 270, 271, and 272; and insulator layers 250 and 252. There may be 2, 3, 4, or any number of conventional (frontside) metal layers, depending on the end use or target application. Contacts can be formed for the S/D regions and the gate using any suitable processes, such as forming contact trenches in insulator material over the respective regions and depositing metal or metal alloy (or other suitable electrically conductive material) in the trenches. In some embodiments, contact formation may include silicidation, germinidation, or annealing processes, for example. The material of the contacts may include aluminum or tungsten, although any suitable conductive metal or alloy can be used, such as silver, nickel-platinum, or nickel-aluminum, for example. In some embodiments, the contacts may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain contact regions, such as adhesion layers (e.g., titanium nitride) and/or liner or barrier layers (e.g., tantalum nitride), if so desired.

As shown in FIG. 2D, contact 260 is electrically connected to S/D region 224 via frontside contact resistance reducing layer 225. Thus, in this example embodiment, contact 260 is a frontside contact, as it makes electrical contact with the S/D regions from the frontside of the device layer of transfer wafer 20, as shown. In some embodiments, frontside contacts need not be present; however, in some embodiments, one or more semiconductor devices (e.g., transistors) formed on the device layer of the final IC structure may be contacted from just the frontside, just the backside, or both the frontside and the backside, as can be understood based on this disclosure. As can also be understood, S/D regions 226 are to be contacted from just the backside, and thus, they do not include frontside contacts as shown in the example structure of FIG. 2D. In this example embodiment, metallization line/layer 270 may be formed using any suitable processes and may be formed of any suitable material, such as copper or aluminum, for example. In this example embodiment, only one metal line/level 270 is shown for ease of illustration; however, any number of back end layers may be formed on the frontside of the device layer. Insulator 250 may be formed using any suitable processes and may be formed of any suitable material, such as a dielectric material, for example. In some embodiments, additional and/or alternative back-end processing may be performed, as will be apparent in light of this disclosure. Note that back-end processing is also referred to as back-end-of-line (BEOL) where individual devices (e.g., transistors, capacitors, resistors, etc.) get interconnected with wiring.

Figure 3:
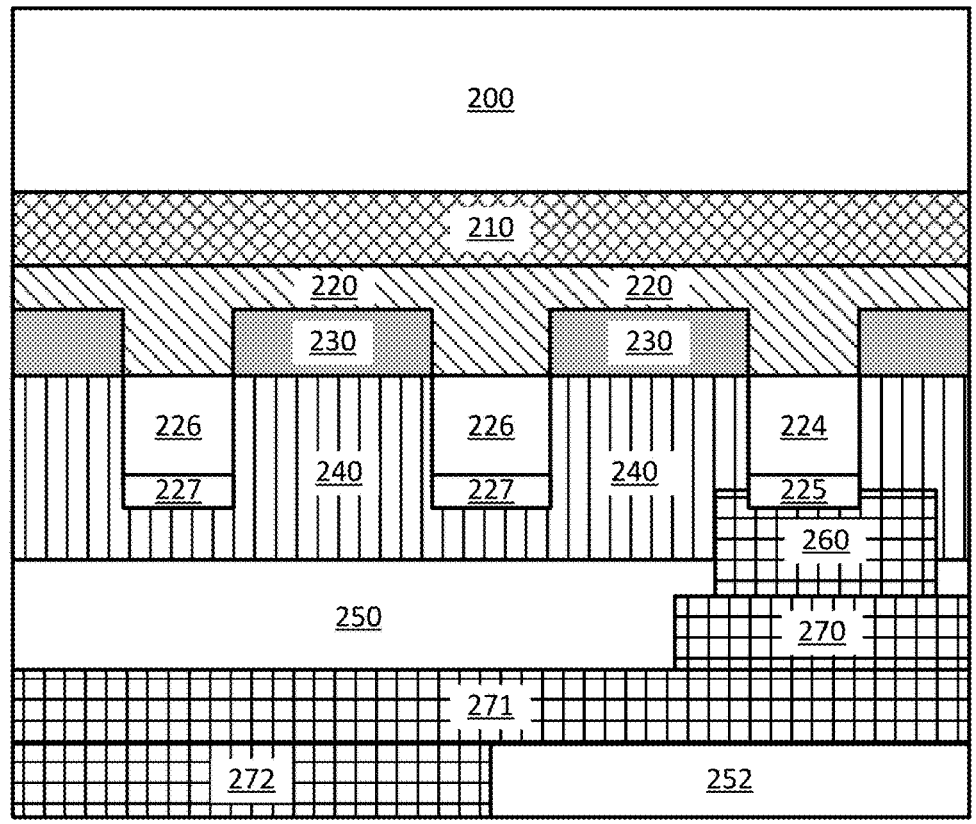
FIG. 3 illustrates the transfer wafer structure of FIG. 2D inverted and being bonded to a host wafer, in accordance with an embodiment of the present disclosure.
Figure 3:
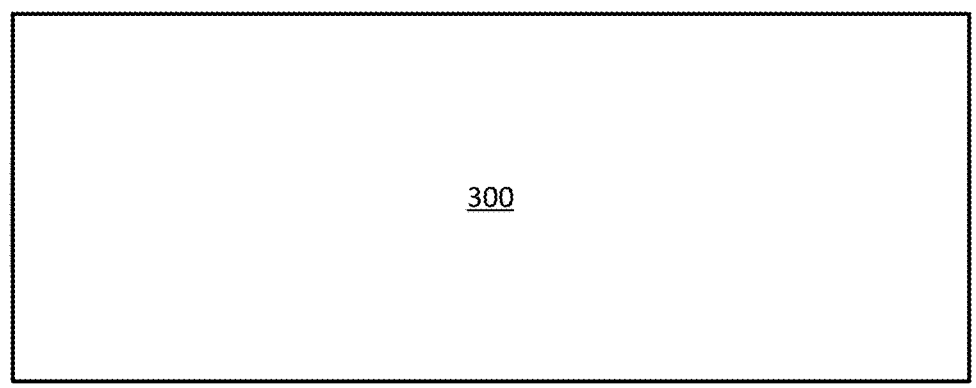
Figure 4:
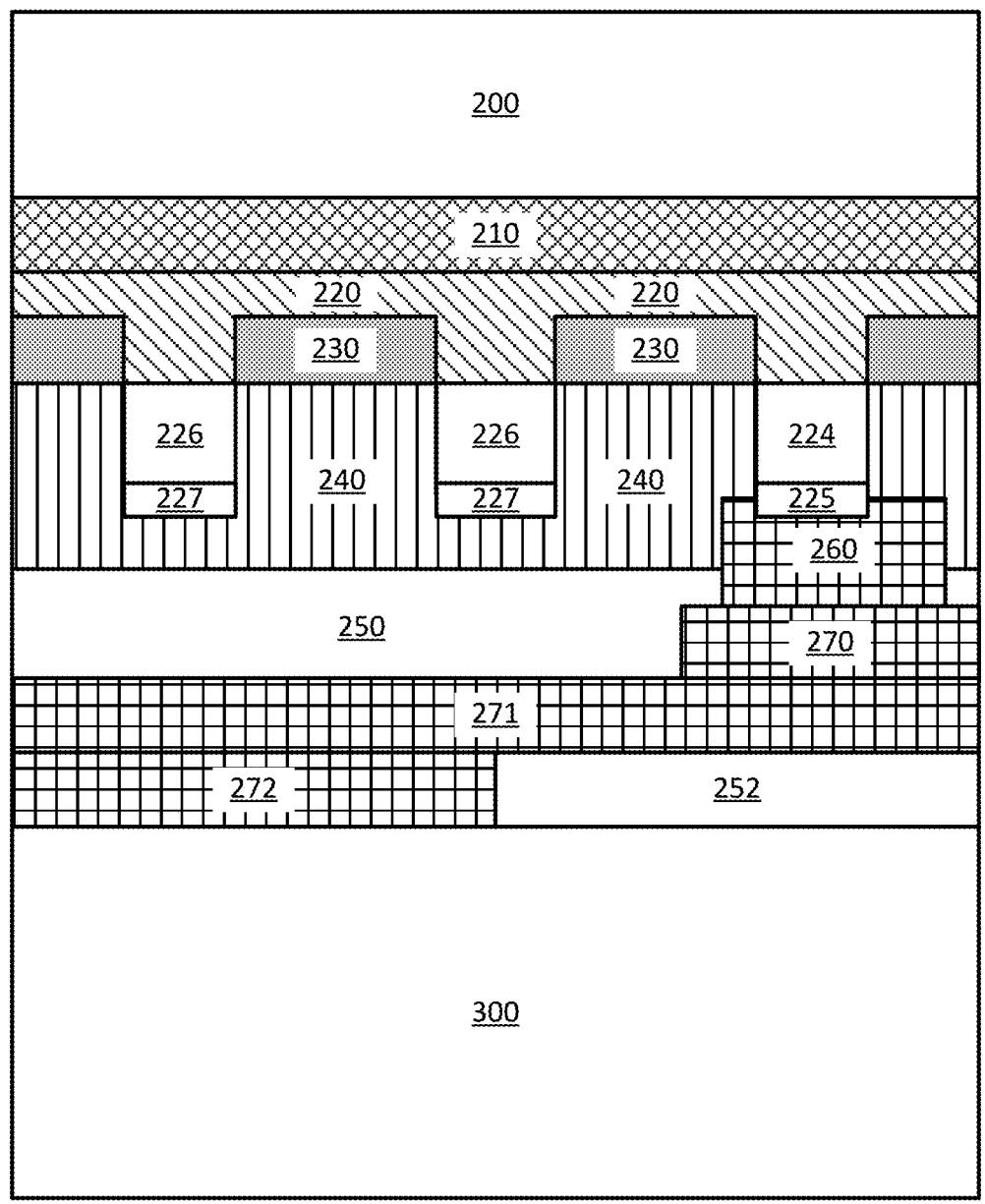
FIGS. 4-4' illustrate an IC structure including a transfer wafer inverted and bonded to a host wafer, where the transfer wafer includes sacrificial S/D material and a multilayer substrate, in accordance with some embodiments of the present disclosure. Note that the example IC structure in FIG. 4A' includes the multilayer substrate of FIG. 2A'.
Figure 4:
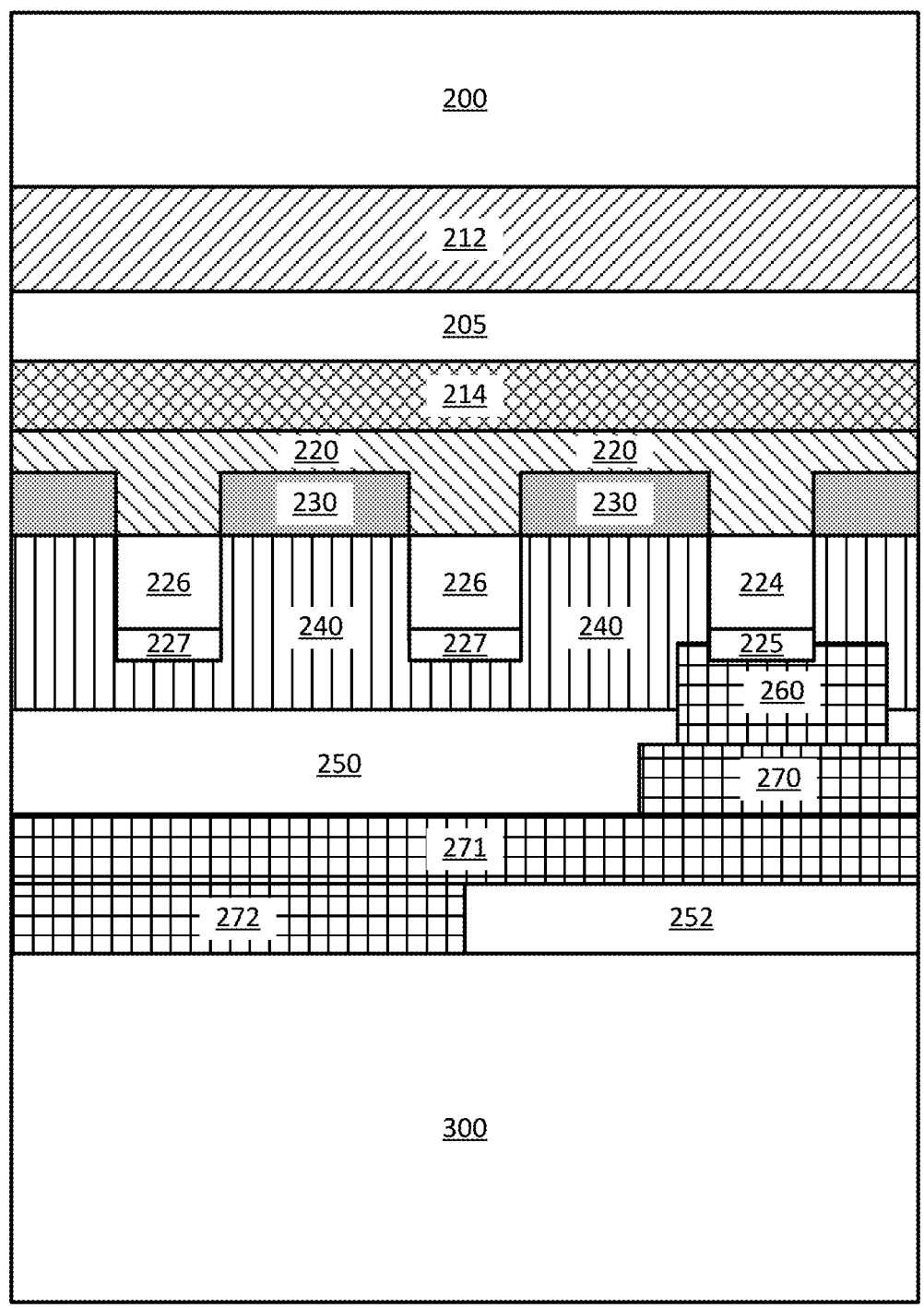

Method 100 of FIG. 1A continues with inverting 112 transfer wafer 20 to be bonded as illustrated in FIG. 3 and bonding the inverted transfer wafer 20 to the host wafer 30 to form the resulting example structure illustrated in FIG. 4, in accordance with an embodiment. As can be understood, transfer wafer structure 20 is the same structure as shown in FIG. 2D, where the one or more transistor devices are formed on a multilayer substrate as variously described herein. The bonding process may be performed using any suitable techniques, such as using any combination of heat, pressure, and/or force to physically connect structure 20 to structure 30. In some cases, the insulator/oxide layer(s) may be bonded to host wafer 300. In some cases, the metal line(s) may be bonded to host wafer 300, such as is also shown in FIG. 4. Although the example resulting structure illustrated in FIG. 4 shows metal lines 270, 271, and 272 as separate lines, they may be fused together into one line, in some cases. FIG. 4' illustrates the example resulting structure after inversion and bonding 112 is performed, where the transfer wafer to be bonded was formed using the example multilayer substrate of FIG. 2A'. Recall that such an example multilayer substrate includes both a fast-etch layer 212 and an etch-stop layer 214 (as well as a transitional layer 205) between the bulk wafer 200 and the device-quality layer 220.

In some embodiments, host wafer 30 may include its own transistor devices prior to bonding transfer wafer to it. Such one or more transistor devices can include any of the following: field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), vertical channel transistor configurations, and/or nanowire (or nanoribbon or gate-all-around) transistor configurations (having any number of nanowires). In addition, the devices formed may include p-type transistor devices (e.g., p-MOS or p-TFET) and/or n-type transistor devices (e.g., n-MOS or n-TFET). Further, the devices may include complementary MOS (CMOS) or complementary TFET (CTFET) or quantum devices (few to single electron). The materials or device types originally included in the host wafer and the transfer wafer, prior to bonding, may be the similar or they may be different. In an example embodiment, it may be desired to fabricate n-MOS transistors on the host wafer 30 (e.g., n-MOS transistors including InGaAs nanowires), while a transfer wafer 20 may include p-MOS transistors (e.g., Ge tri-gate finned p-MOS devices). In such an example embodiment, an additional transfer wafer may be used to bond graphene planar quantum (e.g., few to single electron) transistor devices, for example. Numerous transistor device material combinations, device geometries, and device type variations and configurations will be apparent in light of this disclosure. In some embodiments, the host wafer may be a mechanical support and have no active electronic function, as it may be removed in a final product. Accordingly, the host wafer may include a non-semiconductor material, such as silicon oxide or silicon nitride or other refractory (e.g., alumina or yittria), to provide a few examples. In another embodiment, the host wafer may be a graphite disc with silicon carbide coating for resistance to chemical attack, for example.

Figure 5A:
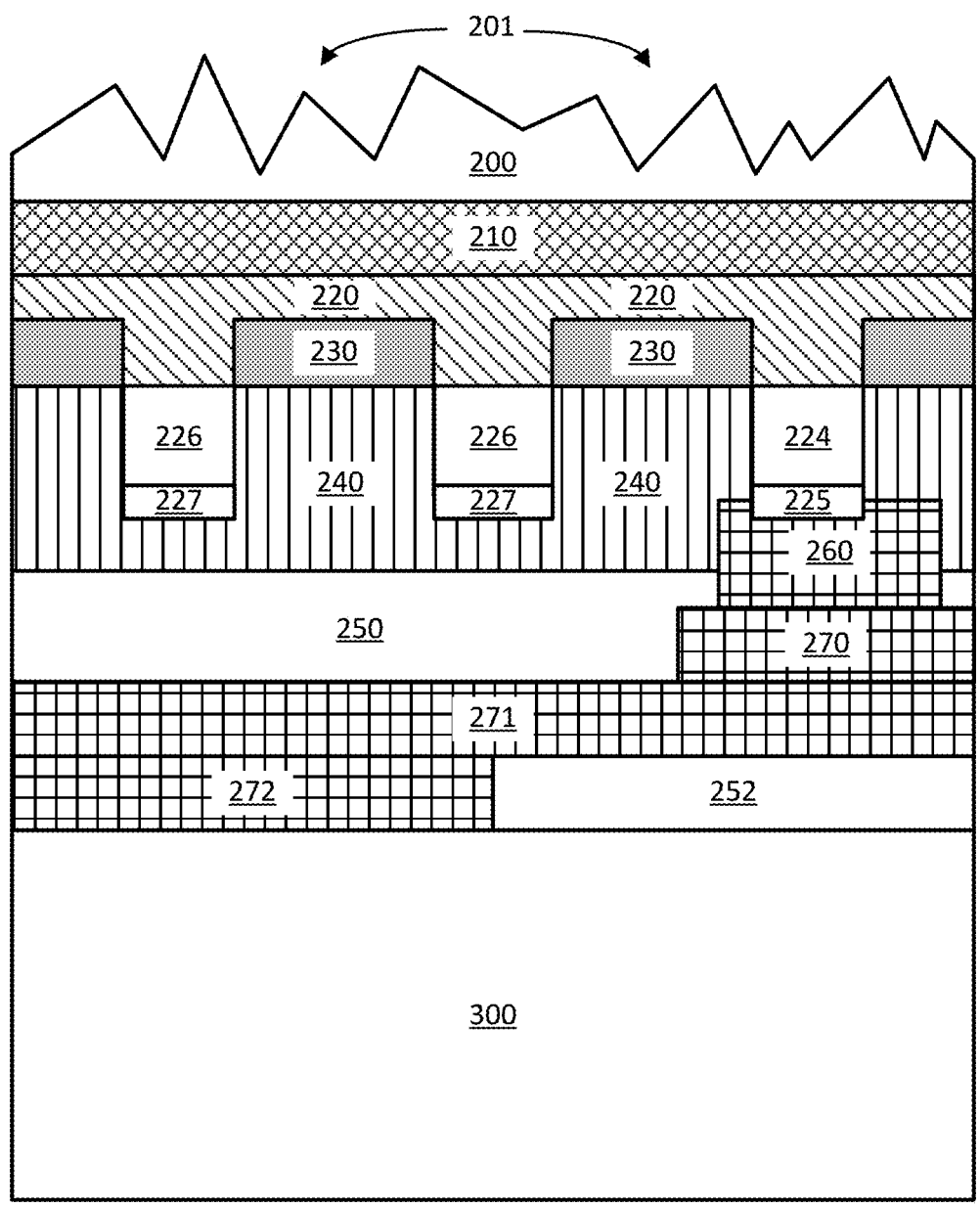
FIGS. 5A-B illustrate resulting IC structures during removal of the bulk wafer layer of the multilayer substrate for a backside reveal of the device layer, in accordance with some embodiments of the present disclosure.
Figure 5A:
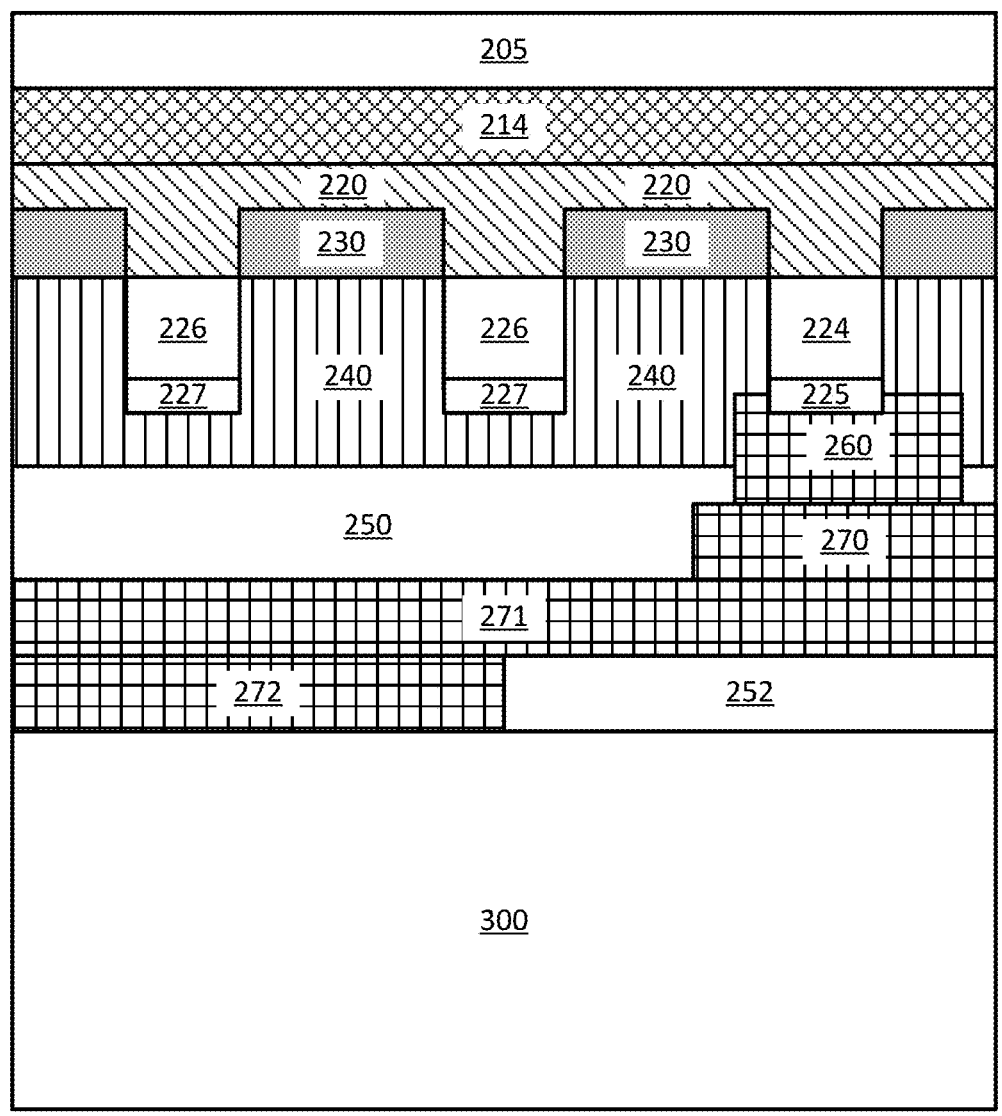

Method 100 of FIG. 1A continues with removing the bulk wafer layer 200 of transfer wafer 20 via either backside grind 114a and etch/polish 115a processes in the case of a sacrificial layer 210 being an etch-stop layer or via a lateral etch 114b in the case of sacrificial layer 210 being a fast-etch layer, in accordance with some embodiments. As can be understood, bulk wafer layers 200 and 300 would be significantly thicker than the other layers in the structure of FIG. 4 (e.g., on the order of at least 1000 times thicker, in some cases) and removal of bulk wafer layer 200 would significantly reduce the thickness of the entire structure, thereby enabling a vertical integration scheme. In configurations where sacrificial layer 210 in the example structure of FIG. 4 is an etch-stop layer, removal of bulk wafer layer 200 may include initially performing a backside grind 114a of the bulk wafer layer 200 to form the resulting example structure of FIG. 5A, in accordance with an embodiment. Backside grind 114a may be performed using any suitable techniques, and in some cases, the backside grind may be performed as close to the active transistors (e.g., as close to device-quality layer 220) as practical, owing, for example, to within-wafer process grind thickness uniformity constraints. As can be seen in FIG. 5A, the resulting structure would typically include a rough backside surface 201 of bulk wafer layer 200 after grind 114a has been performed. After backside grind 114a has been performed to remove bulk wafer material to a point that is near or very close to etch-stop layer 210, method 100 can continue by performing an etch and/or polish process 115a to remove the remainder of bulk wafer layer 200.

Figure 5B:
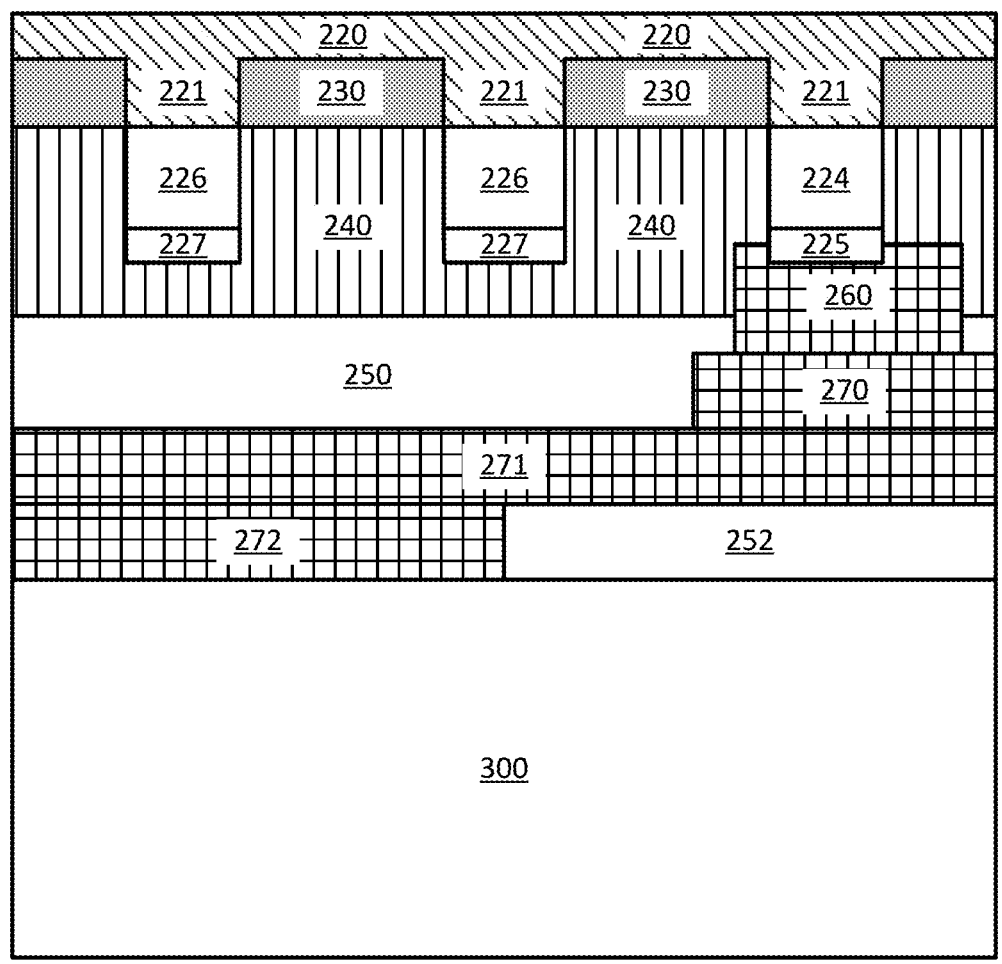

The etch/polish 115a may be performed using any suitable process, based on the material and/or thickness of etch-stop layer 210 (and optionally based on the material/thickness of other layers, such as device-quality layer 220), for example. In some embodiments, etch/polish 115a will remove the entirety of etch-stop layer 210, leaving an example structure such as is illustrated in FIG. 5B. In other embodiments, etch/polish 115a may only partially remove etch-stop layer 210, and thus some of the layer's material may remain on the backside of device-quality layer 220. In some such embodiments, the remaining material of layer 210 may not be present in all locations of the backside of layer 220, as it may be completely removed in some areas and only partially removed in others. In embodiments where bulk wafer layer 200 is Si, an example etchant for etch/polish 115a includes ammonium hydroxide. For example, where bulk wafer layer 200 is Si, an example etch stop material is carbon doped Si (Si:C) with C concentration in the range of 1 to 30%. Numerous different etch-stop materials for layer 210 will be apparent in light of the present disclosure.

In configurations where sacrificial layer 210 in the example structure of FIG. 4 is a fast-etch layer, method 100 may continue from inversion and bonding process 112 by laterally etching 114b the fast-etch layer 210 to release the bulk wafer layer 200, in accordance with an embodiment. Lateral etch 114b can be performed using any suitable process, and in this example embodiment, includes performing a wet etch from the side of the structure to remove fast-etch layer 210, thereby enabling the clean release/liftoff of bulk wafer layer 200. In some embodiments, lateral etch 114b will remove the entirety of fast-etch layer 210, leaving an example structure such as is illustrated in FIG. 5B. In other embodiments, lateral etch 114b may only partially remove fast-etch layer 210, and thus some of the layer's material may remain on the backside of device-quality layer 220. In some such embodiments, the remaining material of layer 210 may not be present in all locations of the backside of layer 220, as it may be completely removed in some areas and only partially removed in others. In any case, use of a fast-etch layer for sacrificial layer 210 may provide the benefit of allowing a clean liftoff of the bulk wafer 200, thereby preserving the wafer for other future uses, for example. In embodiments where the device-quality layer 220 is Si and the transfer bulk wafer 200 to be removed is also Si, an example fast-etch layer 210 is SiGe or SiGe:B and an example etchant for lateral etch 114b is peroxide containing concentrated sulfuric or nitric acid. In embodiments where the device-quality layer 220 is Ge or SiGe with Ge content greater than 80% and the transfer wafer layer 200 to be removed is Si, an example fast-etch layer 210 is GeSn or GeSn:B and an example etchant for lateral etch 114b is buffered dilute nitric or sulfuric acid. In embodiments, where the device-quality layer 220 is SiGe with Ge content of 10-80% and the transfer wafer layer 200 to be removed is Si, an example fast-etch layer 210 is SiGe with approximately 10% or more greater Ge content than the Ge content of the device-quality layer and an example etchant is peroxide containing concentrated sulfuric or nitric acid. In embodiments where the device-quality layer 220 is InGaAs, an example fast-etch layer 210 is GaAs and an example etchant for lateral etch 114b includes a strong base, such as potassium hydroxide or sodium hydroxide. Numerous different fast-etch materials for layer 210 will be apparent in light of the present disclosure.

In the example embodiment illustrated in FIG. 4', recall that the transfer wafer includes a multilayer substrate including both a fast-etch layer 212 and an etch-stop layer 214. In such an example embodiment, removal of bulk wafer layer 200 may include performing lateral etch 114b as previously described to partially or completely remove fast-etch layer 212 and allow for the clean release/liftoff of bulk wafer layer 200. An example resulting structure after the lateral etch 114b is performed is shown in FIG. 5A' (where fast-etch layer 212 was completely removed). The method can then continue with performing etch/polish 115a as previously described to completely remove transitional layer 205 and partially or completely remove etch-stop layer 214. An example resulting structure after the etch/polish 115a is performed is shown in FIG. 5B (where etch-stop layer 214 was completely removed).

Figure 6A:
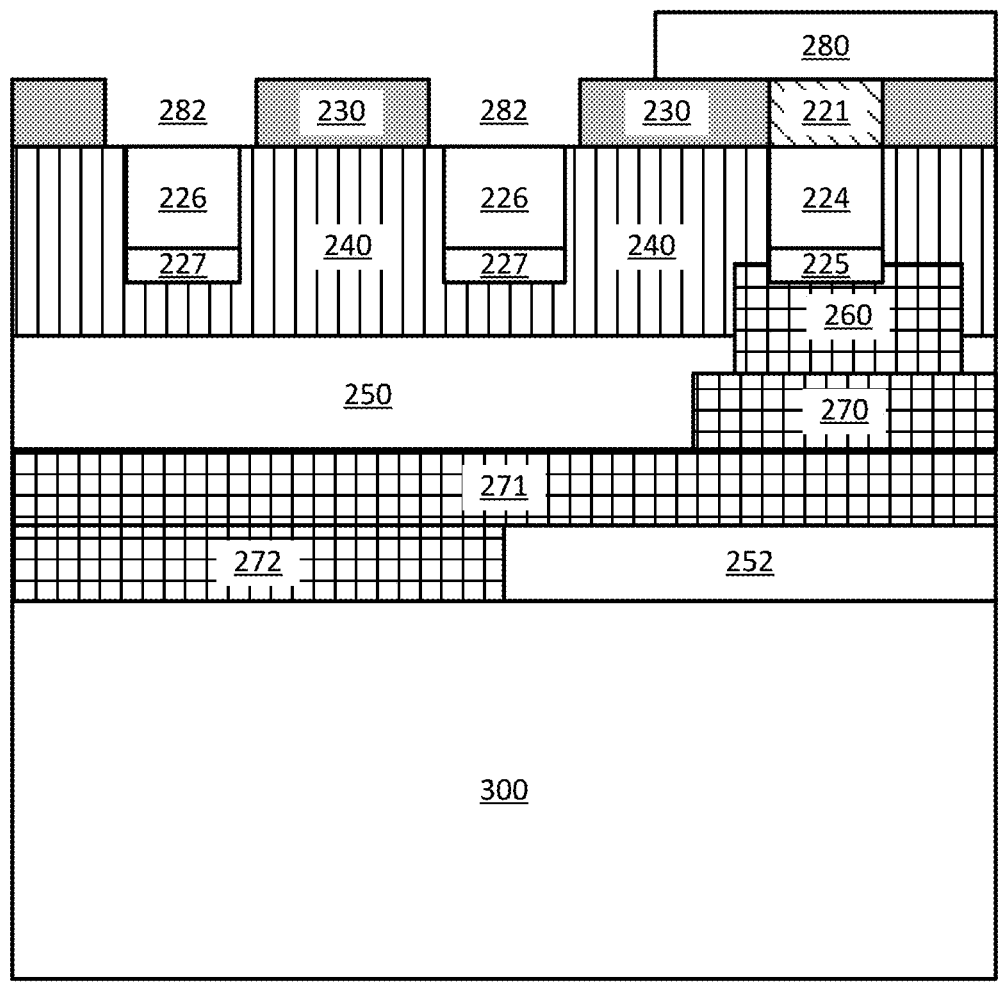
FIG. 6A illustrates an example IC structure after backside processing is performed on the structure of FIG. 5B, including forming backside S/D contact trenches, in accordance with an embodiment of the present disclosure.

Method 100 continues with performing 116 backside processing after the backside reveal has been performed to form the example structures of FIGS. 6A-E, in accordance with some embodiments of the present disclosure. As can be seen in the example structure of FIG. 6A, the backside processing 116 is performed on the backside of the structure 20 added to the host wafer 30, after a backside reveal was performed to expose the backside of the device layer (e.g., as previously described). Such a backside reveal, in this example embodiment, included removing the multilayer substrate and the majority of the device-quality layer 220, except for the portion below the sub-fin 221 as shown. The backside processing then continues with planarizing (and/or polishing) 118 to remove material 220 and add backside hardmask layer 280 and patterning that backside hardmask layer 280 to form 120 backside contact trenches 282 to gain access to the backside of S/D regions 226, as shown in FIG. 6A. Hardmask layer 280 may be formed using any suitable process and may include any suitable material, such as a dielectric, oxide, and/or nitride material. In some embodiments, a single etch process may be used to remove both STI 230 material and device layer and/or sub-fin 221 material, to form backside contact trenches 282 and gain access to the backside of the S/D regions 226 as shown, for example. While in other embodiments, multiple etch processes may be used to form contact trenches 282 and gain access to the backside of the S/D regions 226, for example.

Note that in this example embodiment, the backside reveal and formation of backside contact trenches 282 are performed to gain access to sacrificial S/D regions 226 in order to remove and replace the sacrificial material 226 with final or functional S/D material for those regions. However, in some embodiments, the backside reveal and formation of backside contact trenches may also be performed for other suitable purposes, such as to contact final S/D regions via the backside of the device layer, as will be apparent in light of this disclosure. For instance, if S/D regions 224 were to be contacted from the backside in addition to being contacted from the frontside, backside contact trenches may be formed above S/D regions 224 to allow such backside contact to those S/D regions 224. Such processing may also include the formation of backside contact resistance reducing layers prior to forming the backside contacts to, for example, assist with ohmic contact from the backside at those S/D regions. However, in this example embodiment, S/D regions 224 are only contacted from the frontside. Also note that in FIGS. 6A-E, the frontside of the device layer (which is the layer include S/D regions 224, 226, and 228) is located relatively closer to host wafer 300 (closer to the negative Y axis) and the backside of the device layer is located relatively farther from host wafer 300 (farther from the negative Y axis), as the device layer was previously inverted and bonded to host wafer 300 (and the layers previously formed thereon), as can be understood based on this disclosure. Further note that although gate 240 can be seen in the cross-sectional views of FIGS. 6A-E, in some embodiments, that portion would be covered with interlayer dielectric material, as can be understood based on this disclosure. However, the gate is shown for purposes of illustration and description.

Figure 6B:
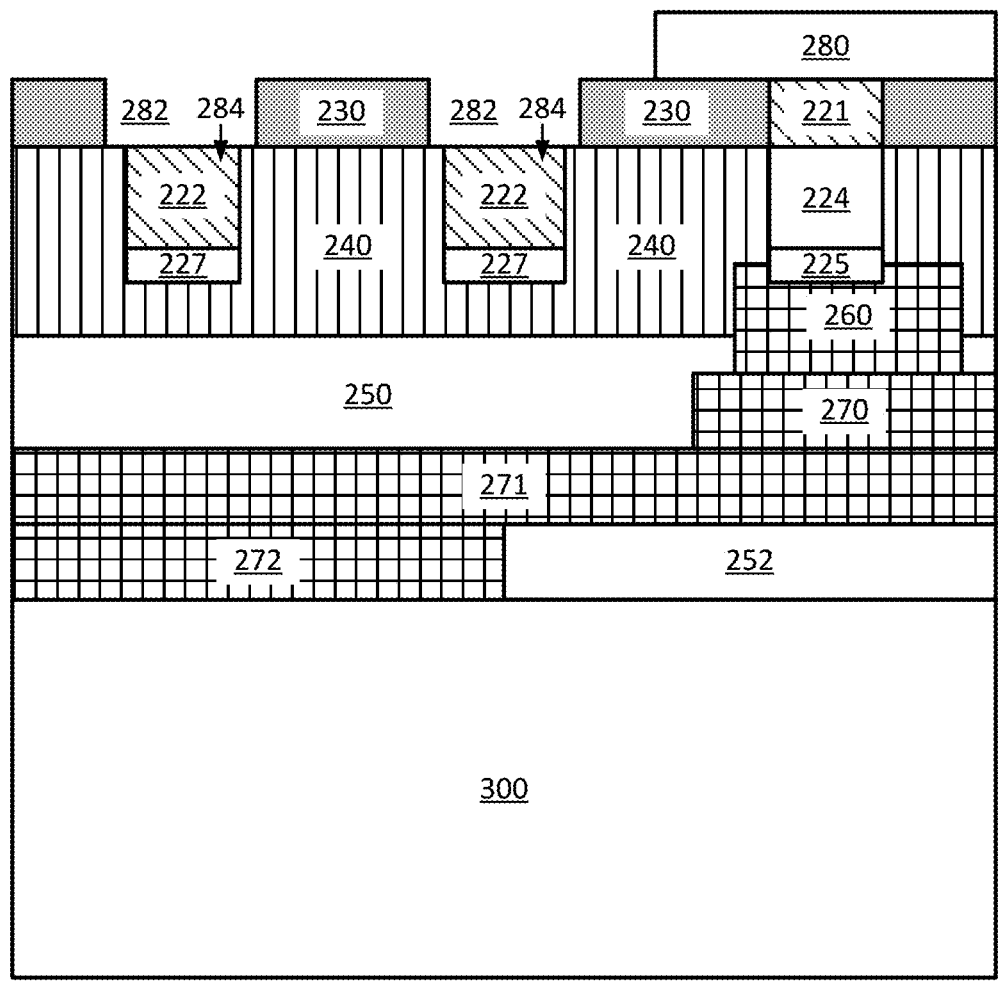
FIG. 6B illustrates an example IC structure after the sacrificial S/D material of the structure of FIG. 6A has been removed through the backside S/D contact trenches, in accordance with an embodiment of the present disclosure.

Method 100 continues with additional backside processing, which includes performing 122 a selective etch to remove the sacrificial S/D material 226 without completely removing seed layer material 227 to form the example structure of FIG. 6B, in accordance with an embodiment. As shown in FIG. 6B, the selective etch process 122 that removes the sacrificial S/D material 226 forms backside S/D trenches 284, thereby exposing the sides of the channel region, which in this example case, was formed using fins 222 of device-quality layer 220. Thus, the portion of fins 222 shown is the portion that can be used for the channel region of one or more transistor devices, and such channel regions may or may not have been altered from the original device-quality layer (e.g., doped, removed and replaced during replacement gate processing, formed into one or more nanowires or some other suitable configuration, and so forth), depending on the particular embodiment. Selective etch 122 may be performed using any suitable techniques, such as using a wet etch with a given etchant that selectively removes material 226 through backside contact trenches 282 from the structure of FIG. 6A, while still leaving at least a portion of seed layer 227 in S/D trenches 284 to allow for the subsequent growth therefrom of the final S/D material in those S/D regions. As can be understood based on this disclosure, without seed layer 227 from which to grow the final S/D material, that final S/D material would be of relatively lower quality and may not have the desired high-quality crystalline structure (e.g., a monocrystalline structure) as the final S/D material would otherwise be grown from insulator material, resulting in a polycrystalline or amorphous material structure. As can also be understood, seed layer 227 can act as an etch stop when performing selective etch process 122.

As can be understood based on this disclosure, the etchant used to selectively remove sacrificial S/D material 226 and leave at least a portion of seed layer 227 may be any suitable etchant and may be selected based on the material of features 226 and 227, for example. As previously described, seed layer 227 may have at least one of the following to assist with the selectivity of the etch process 122: a lower impurity dopant concentration (e.g., at least 1E19 atoms per cubic cm less impurity dopants); a lower alloying concentration (e.g., at least 10% less Ge concentration if both features 226 and 227 include SiGe); a dilute carbon alloying component (e.g., at least 1% C alloying in the seed layer); and/or any other suitable difference as will be apparent in light of this disclosure. As was also previously described, in some embodiments, the seed layer 227 may have an etch rate that is less than that of the sacrificial S/D material 226 for a given etchant, such that the given etchant is capable of removing the sacrificial S/D material 226 at a rate of at least 2, 3, 4, 5, 10, 15, 20, 25, 30, 40, or 50 times faster than the rate at which the given etchant removes the seed layer material 227, or some other suitable minimum relative rate as can be understood based on this disclosure.

Figure 6C:
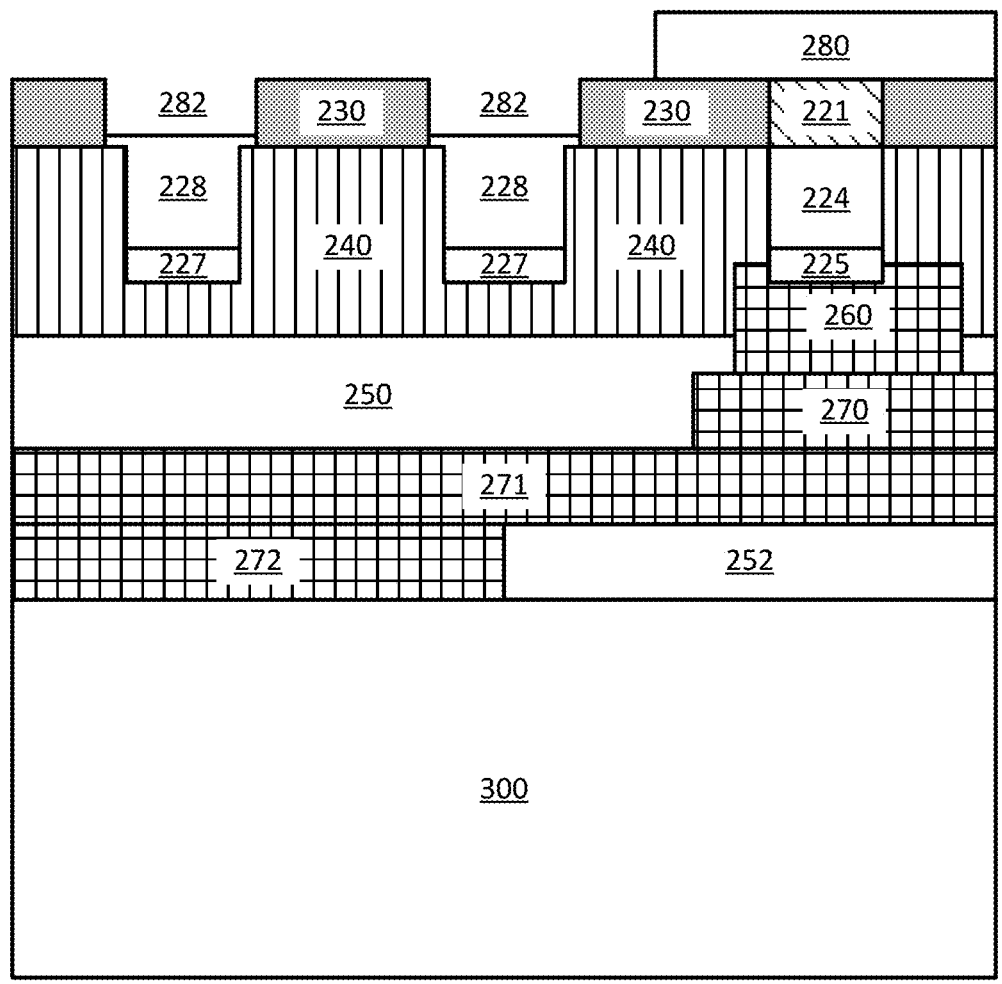
FIG. 6C illustrates an example IC structure after final S/D material is formed on a seed layer of the structure of FIG. 6B, in accordance with an embodiment of the present disclosure.

Method 100 continues with forming 124 the final S/D material 228 using seed layer 227 to form the example structure of FIG. 6C, in accordance with an embodiment. As can be seen in FIG. 6C, the final S/D material 228 was formed in S/D trench 284 and a portion of the final S/D material 228 grew into backside contact trenches 282, in this example embodiment. In some embodiments, the final S/D material 228 may be formed using any suitable technique(s), such as via a deposition process described herein (e.g., CVD, ALD, MBE, etc.) or any other suitable deposition process as will be apparent in light of this disclosure. As can be understood based on this disclosure, seed layer 227 provides a surface on which the final S/D material 228 can be deposited (or from which the final S/D material 228 can be grown). In some embodiments, the seed layer material 227 and the final S/D material 228 may include similar material to, for example, facilitate high-quality formation of the final S/D material 228, leading to improved performance of transistor based devices including the material 228. For instance, in some embodiments, seed layer material 227 may primarily include group IV material (e.g., Si or SiGe, with or without dilute C alloying) and final S/D material 228 may also primarily include group IV material (e.g., Si, SiGe, or Ge, typically with suitable n-type or p-type dopants). In another instance, in some embodiments, seed layer material 227 may primarily include group III-V material (e.g., GaAs, InGaAs, or InP) and final S/D material 228 may also primarily include group III-V material (e.g., GaAs, InGaAs, or InP, typically with suitable n-type or p-type dopants).

In some embodiments, final S/D material 228 may include any suitable semiconductor material, such as group IV material (e.g., Si, SiGe, Ge) and/or group III-V material (e.g., GaAs, InGaAs, InP), or any other suitable source/drain material as will be apparent in light of this disclosure. In some embodiments, final S/D material 228 may include suitable n-type and/or p-type impurity dopants, and such dopants may be in concentrations relatively higher than what would have been practical if the final S/D material was formed during frontside processing of the device layer. This is due to higher S/D dopant levels (e.g., greater than 1E20 atoms per cubic cm) in the initial S/D regions prior to the bonding process leading to diffusion of such dopants into the channel region during processing that occurs between the frontside S/D processing and this backside S/D processing, such as high temperature annealing that may occur, for example, during the bonding process used in the MOBS scheme. Accordingly, in some embodiments, the final S/D material 228 may include dopants (e.g., suitable n-type or p-type dopants) in concentrations of greater than 1E19, 1E20, 5E20, 1E21, or 5E21 atoms per cubic cm, or some other suitable threshold amount as will be apparent in light of this disclosure. Such relatively highly doped S/D regions 228 may be doped in such a manner to promote ohmic contact and thereby improve performance of the transistor device in which the final, highly doped S/D is included.

To provide more specific examples, for illustrative purposes, in an embodiment including a Si channel p-MOS device (and thus having p-type doped final S/D regions), the S/D regions 228 could include SiGe:B with at least 1E20 B atoms per cubic cm (e.g., approximately 5E20 atoms per cubic cm) or Ge:B with at least 1E20 B atoms per cubic cm (e.g., approximately 5E20 atoms per cubic cm), for instance. In another example case, in an embodiment including a Si channel n-MOS device (and thus having n-type doped final S/D regions), the S/D regions 228 could include Si:P with at least 5E20 P atoms per cubic cm (e.g., approximately 1E21 atoms per cubic cm), for instance. Note that, in some embodiments, the final S/D material 228 may include a multilayer structure and/or may include grading (e.g., increasing and/or decreasing) the content of one or more materials throughout the features. For instance, when forming S/D regions 228, the final portion of the deposition process may include increasing the doping concentration in a steady or sudden manner (e.g., to assist with ohmic contact). In some embodiments, final S/D material 228 may include a doping concentration (e.g., of any suitable n-type or p-type dopants) that is at least 1E17 to 1E21 atoms per cubic cm (e.g., at least 1E19 atoms per cubic cm) greater than the dopant concentration of a corresponding seed layer 227 on which the S/D material 228 is formed, or some other suitable threshold relative amount as will be apparent in light of this disclosure. Since the wafer is planar at this point, deposition can be conducted in a non-selective manner and excess replacement material deposition can be removed using a planarization process, if so desired.

In some embodiments, processes 122 and 124 may be repeated, depending on the amount of sets of sacrificial S/D regions are to be removed and replaced with final S/D material. For example, in embodiments where final p-type S/D regions (e.g., for p-MOS devices) and final n-type S/D regions (e.g., for n-MOS devices) are to be formed via backside removal and replacement of sacrificial S/D regions, the different sets of regions may be processed separately, which may include masking off one set of regions while the other is being processed. Such a masking process may be performed prior to or after selective etch process 122 is performed to remove some or all of the sacrificial S/D regions. For instance, in an example embodiment, after forming 120 backside S/D contact trenches to gain access to sacrificial S/D regions, selective etch 122 may be performed to remove all of the sacrificial S/D material, followed by masking off the S/D regions intended to be one of n-type and p-type, forming the final material for the other of the n-type and p-type S/D regions, masking off those final S/D regions that were just formed, and forming the final material for the originally masked off S/D regions. In another example embodiment, the masking processes may be performed prior to performing selective etch processes 122, such that the sacrificial S/D material is removed just before forming the final S/D material per each set of regions. In any sense, numerous suitable techniques may be used to remove sacrificial S/D material (formed during frontside processing) and replace it with final S/D material during backside processing within the context of a MOBS scheme. Further note that the techniques and principles disclosed herein need not be limited to the context of a MOBS scheme. For example, the techniques may be used generally to remove and replace S/D material from the backside of a device layer in a vertically integrated IC, as can be understood based on this disclosure.

Figure 6D:
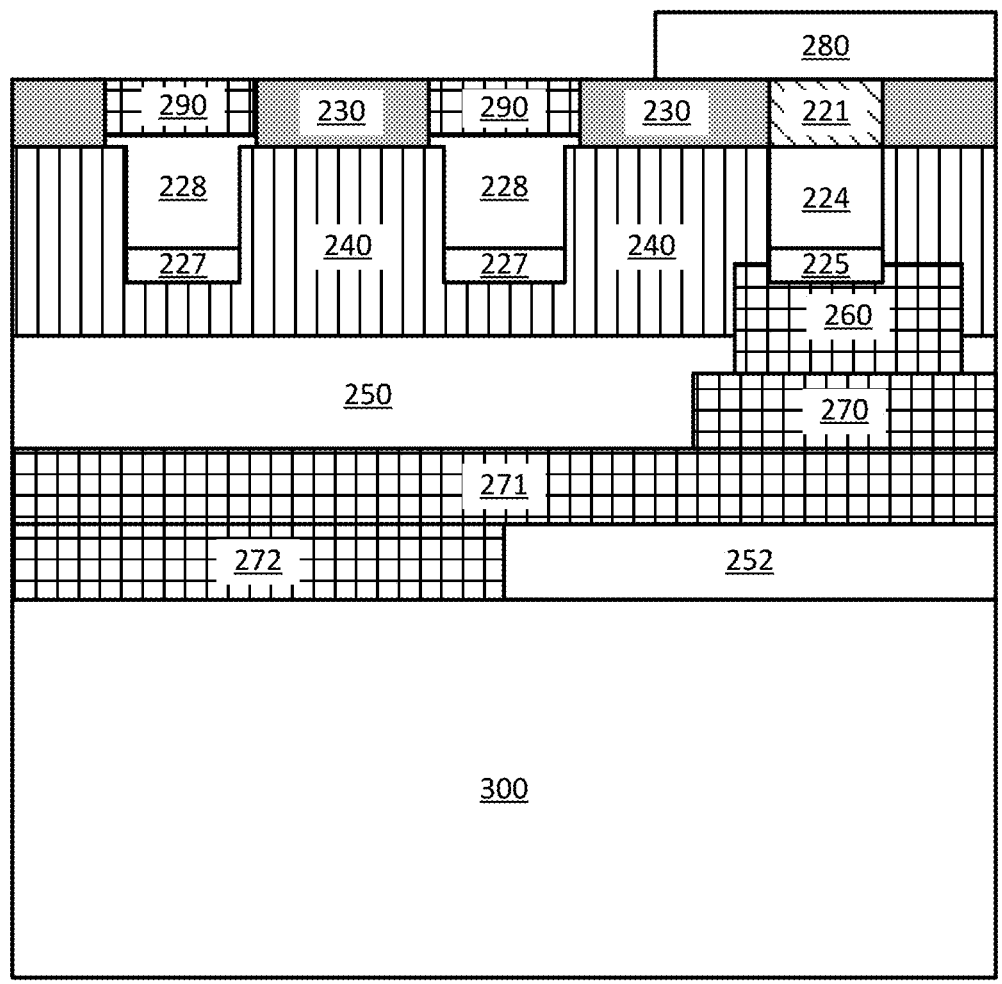
FIG. 6D illustrates an example IC structure after backside S/D contacts are formed in the backside S/D contact trenches of the structure of FIG. 6C, in accordance with an embodiment of the present disclosure.

Method 100 continues with forming backside S/D contacts 290 to form the example structure of FIG. 6D, in accordance with an embodiment. In this example embodiment, contacts 290 are backside contacts, as they make electrical contact with the S/D regions 228 from the backside of the device layer (from transfer wafer 20), as shown. In some embodiments, backside S/D contacts 290 may be formed using any suitable techniques, such as depositing metal or metal alloy (or other suitable electrically conductive material) in backside contact trenches 282, for example. In some embodiments, contact formation may include silicidation, germinidation, or annealing processes, for example. The material of the contacts may include aluminum or tungsten, although any suitable conductive metal or alloy can be used, such as silver, nickel-platinum, or nickel-aluminum, for example. In some embodiments, the contacts may include a resistance reducing metal and a contact plug metal, or just a contact plug, depending on the end use or target application. Example contact resistance reducing metals include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the source/drain contact regions, such as adhesion layers (e.g., titanium nitride) and/or liner or barrier layers (e.g., tantalum nitride), if so desired.

Figure 6E:
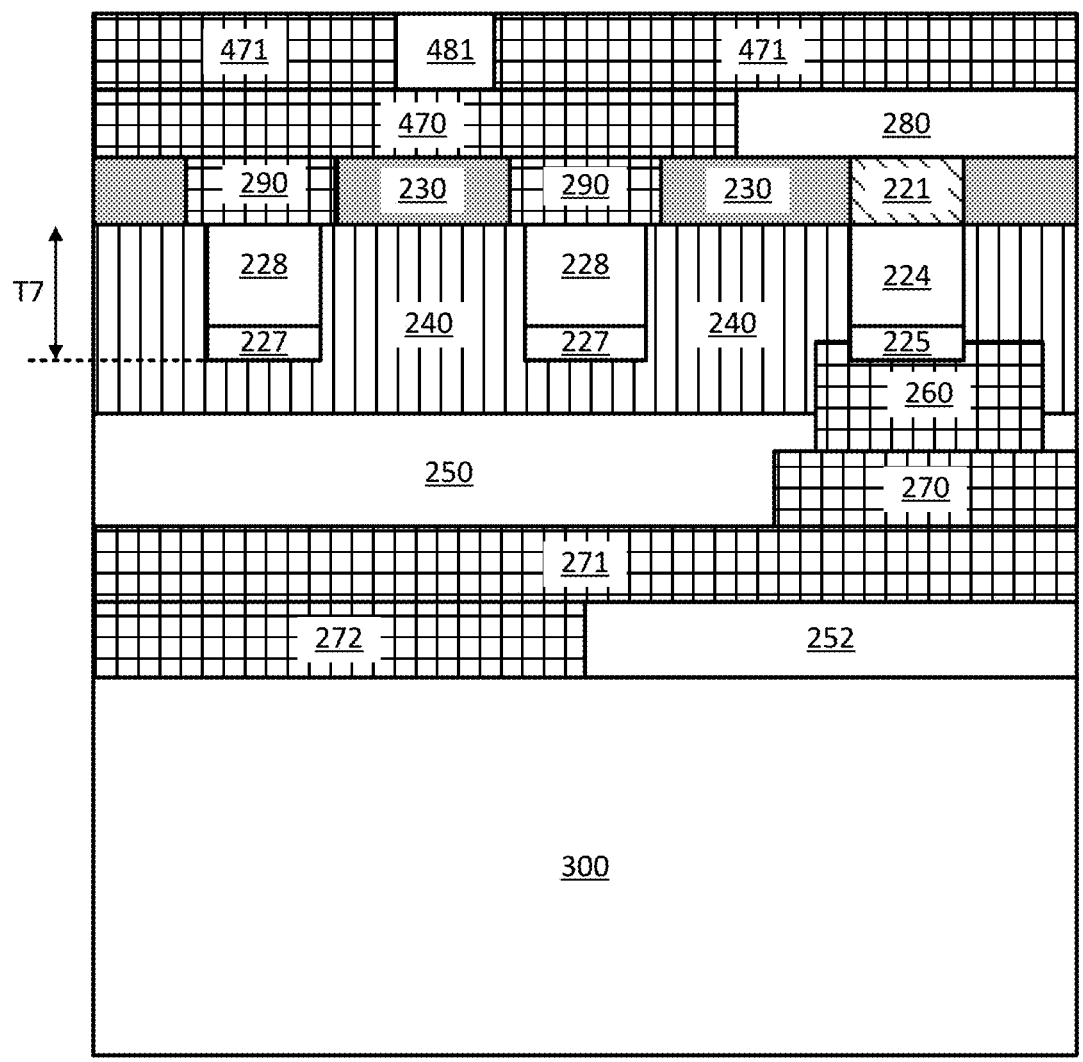
FIG. 6E illustrates an example IC structure after backside back-end (BBE) processing is performed on the structure of FIG. 6D, in accordance with an embodiment of the present disclosure.
Figure 6E:
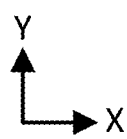

Method 100 continues with performing 128 backside back-end (BBE) processing to form the example structure of FIG. 6E. In this example embodiment, the BBE processing included forming metallization layer/line 470, interlayer dielectric (ILD) layer 481, and metallization layer/line 471. Metallization layers 470, 471 may be formed using any suitable processes and may be formed of any suitable material, such as copper or aluminum, for example. In this example embodiment, two metal lines/levels 470, 471 are shown for ease of illustration; however, any number of BBE layers may be formed. Insulator 481 may be formed using any suitable processes and may be formed of any suitable material, such as a dielectric material, for example. In some embodiments, additional and/or alternative BBE processing may be performed, as will be apparent in light of this disclosure. Note that in some embodiments, S/D regions may be contacted from the frontside only, the backside only, or both the frontside and the backside, as can be understood based on this disclosure. Also note that, in some embodiments, the backside replacement S/D techniques may be used if making contact to the transistor gate from the backside and/or the frontside, for example.

As can be seen in FIG. 6E, the active device portion of the structure (e.g., the portion including the channel region and the source and drain regions) has a thickness indicated as T7. In some cases, thickness T7 may be less than 500, 300, 200, 100, 50, or 25 nm, or any other suitable maximum thickness as will be apparent in light of this disclosure. Recall that various different transistor device geometries can benefit from the MOBS integration techniques and backside S/D replacement techniques described herein including, but not limited to, field-effect transistors (FETs), metal-oxide-semiconductor FETs (MOSFETs), tunnel-FETs (TFETs), planar transistor configurations, dual-gate transistor configurations, finned transistor configurations (e.g., fin-FET, tri-gate), vertical channel configurations, and nanowire (or nanoribbon or gate-all-around) transistor configurations. In addition, the techniques may be used for p-type transistor devices (e.g., p-MOS or p-TFET) and/or n-type transistor devices (e.g., n-MOS or n-TFET). As can be understood based on this disclosure, MOS or MOSFET devices typically have a source-channel-drain configuration of p-n-p types (e.g., for p-MOS) or n-p-n types (e.g., for n-MOS), while TFET devices typically have a source-channel-drain configuration of p-i-n types (e.g., for p-TFET) or n-i-p types (e.g., for n-TFET) where 'i' stands for intrinsic or undoped (or minimally doped) material. Therefore, the appropriate doping scheme can be selected based on the desired configuration. Further, the techniques may be used for complementary MOS (CMOS) or complementary TFET (CTFET) devices (where such complementary devices include both an n-channel and a p-channel device), or for quantum devices (few to single electron), for example. Numerous variations and configurations on method 100 and the integration techniques and structures described herein will be apparent in light of the present disclosure.

Figure 7C:
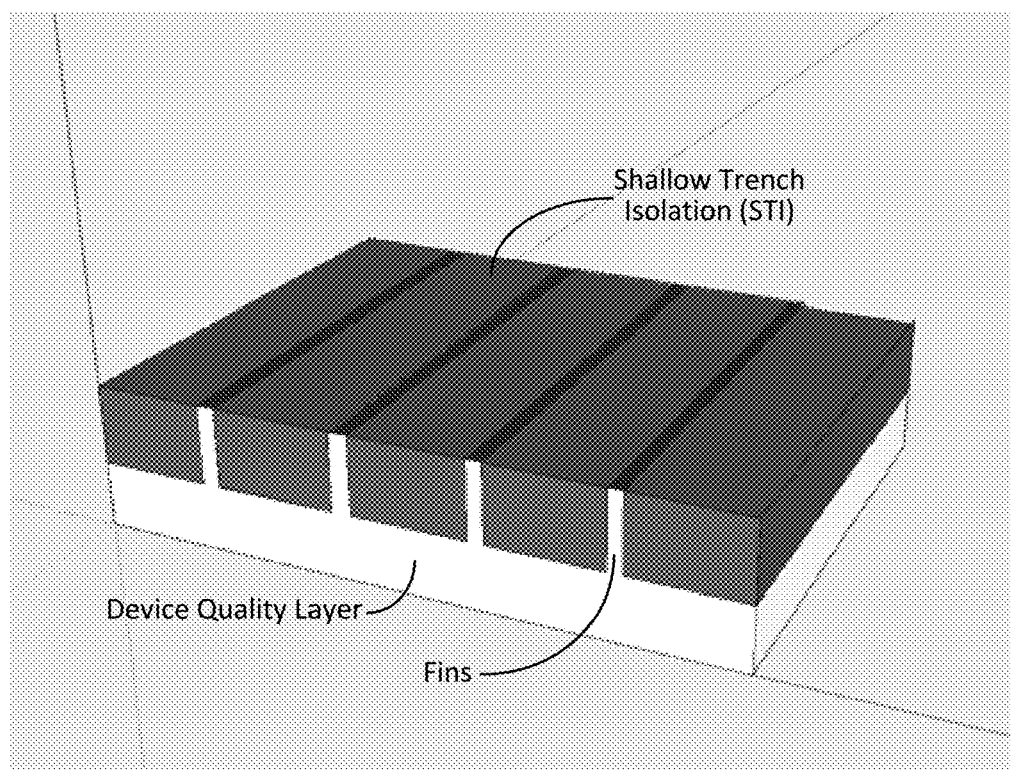
Figure 7D:
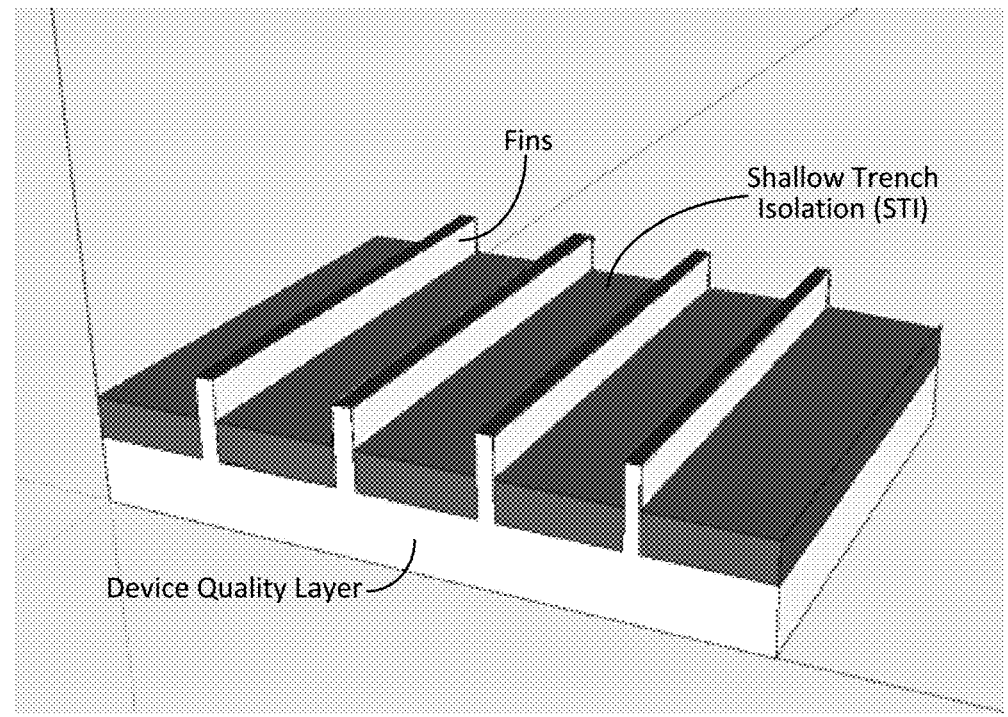
Figure 7E:
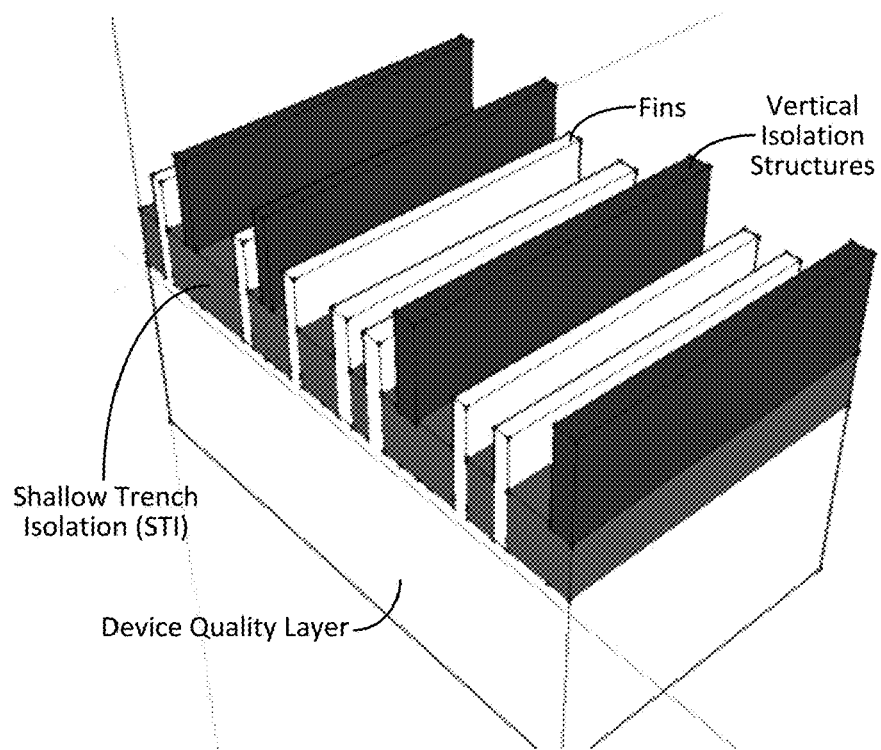

FIGS. 7A-M illustrate perspective views of example IC structures formed when carrying out the method 100 of FIGS. 1A-B, in accordance with some embodiments of the present disclosure. The previous relevant description provided herein is equally applicable to the example structures of FIGS. 7A-M. For instance, the previous relevant discussion with respect to sacrificial S/D regions 226 is equally applicable to the sacrificial S/D regions formed in the example structure of FIG. 7G, to provide an example. FIG. 7A illustrates a device quality layer with hard mask strips that have been lithographically patterned and etched onto the device quality layer. As can be understood based on this disclosure, the device quality layer may be similar to layer 220 as variously described herein. Therefore, in some embodiments, the device quality layer may be formed on a transfer wafer including a bulk wafer/substrate (e.g., bulk substrate/wafer 200 described herein) and one or more layers to form a multilayer substrate that enables transfer-to-host wafer integration for backside reveal purposes, which can be used in a MOBS integration scheme. As can be seen in FIG. 7A, the multilayer substrate is not shown for ease of illustration. However, in some embodiments, the device quality layer may be formed using any suitable multilayer substrate configuration (such as one of the multilayer substrates shown in FIG. 2A or 2A' and variously described herein), for example. In this example embodiment, device quality layer may include any suitable semiconductor material, such as group IV and/or group III-V material. The hard mask strips shown may all be of a single width or multiple widths to form, respectively, fins of a single width or multiple widths, as can be understood. The hard mask strips may include any suitable material, such as a dielectric material, for example.

The method continues with performing one or more shallow trench recess (STR) etches (e.g., one or more wet and/or dry etches) to form multiple fins from the device quality layer, as shown in FIG. 7B, in accordance with an embodiment. As is also shown, the fins are separated by fin trenches. Note that although the fins and fin trenches all have similar dimensions, the present disclosure is not intended to be so limited. For example, in some embodiments, fins of varying heights (dimension in the Y direction) and widths (dimension in the X direction) may be formed, as well as fin trenches of varying heights and widths, as can be understood based on this disclosure. The method continues with shallow trench isolation (STI) processing to form the example structure of FIG. 7C, in accordance with an embodiment. Such STI may be processed and include material similar to STI 230 variously described herein, for example. The method continues with recessing the STI material to form the example structure of FIG. 7D, in accordance with an embodiment. Such a recess of the STI material may be performed using any suitable techniques. In some embodiments, vertical isolation structures may be formed to, for example, further isolate (or electrically insulate) single fins or groups of fins. For instance, in the example structure of FIG. 7E, such vertical isolation structures are present and may be included to prevent the eventual S/D of one transistor device from shorting the S/D of another (e.g., neighboring) transistor device by ensuring the respective S/D regions stay separate. Accordingly, such vertical isolation structures may be formed using any suitable techniques and they may include any suitable electrical insulator material, such as a dielectric, oxide, nitride, and/or carbide material, for instance. Note that although the vertical isolation structures (shown in black) are higher (dimension in the Y direction) than the semiconductor fins, the present disclosure is not intended to be so limited. The method will continue using the example structure of FIG. 7E to assist with illustrating subsequent IC structures including the vertical isolation structures. However, such vertical isolation structures need not be present in some embodiments.

Figure 7F:
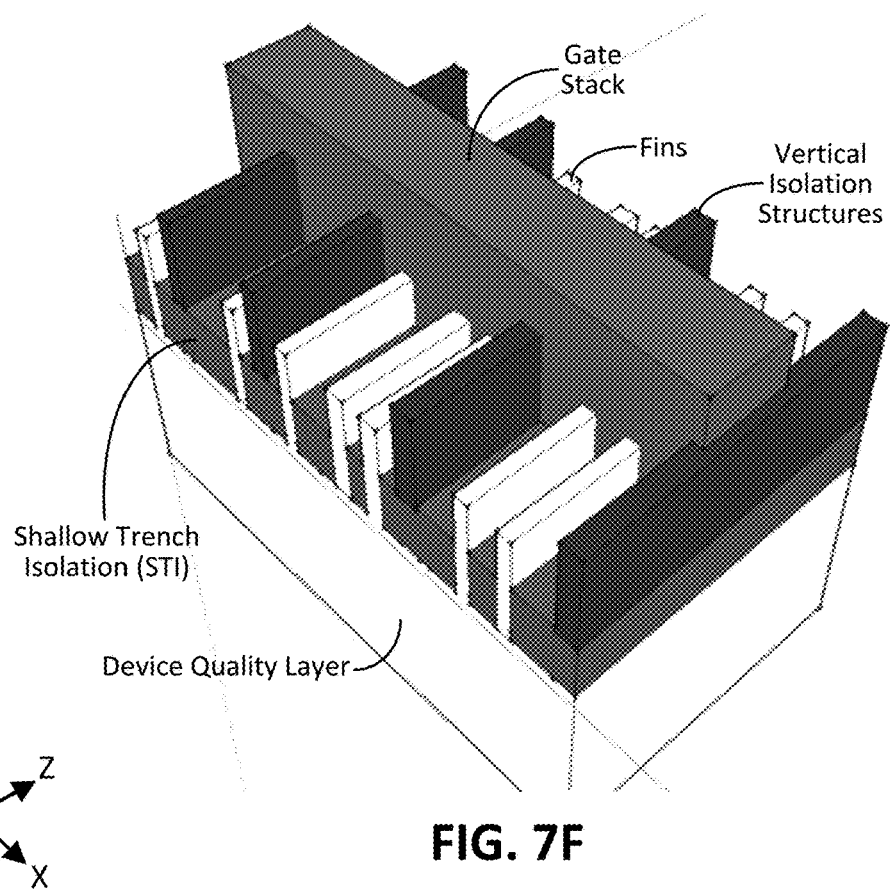

The method continues with gate stack processing to form the example structure of FIG. 7F, in accordance with an embodiment. Such gate stack processing, in some embodiments, may include a gate first or gate last process. For instance, in a gate first process, the final gate stack (e.g., including the gate dielectric and the gate) may be formed at this stage, while in a gate last process, the gate stack formed in FIG. 7 may be a dummy gate stack that will be later replaced by the final gate stack. Further note that the channel regions (the portions of the fins under the gate stack) may employ native substrate material or replacement material, either of which may be undoped or doped (e.g., with any suitable n-type or p-type dopants). In the case of replacement material channel, the replacement material may be blanket deposited and subsequently formed into fins or the native fins may be converted into trenches in the STI and refilled epitaxially, for example. The channel material may include any suitable group IV semiconductor material (e.g., Si, Ge, SiGe), group III-V semiconductor material (e.g., InGaAs, GaAs, InGaSb, InP), and/or any other suitable material as will be apparent in light of this disclosure. Note that in the case of an IC structure including both n-channel and p-channel transistors, the primary channel material for both such transistors may be the same or different (e.g., where the same, the dopant type may be different).

Figure 7G:
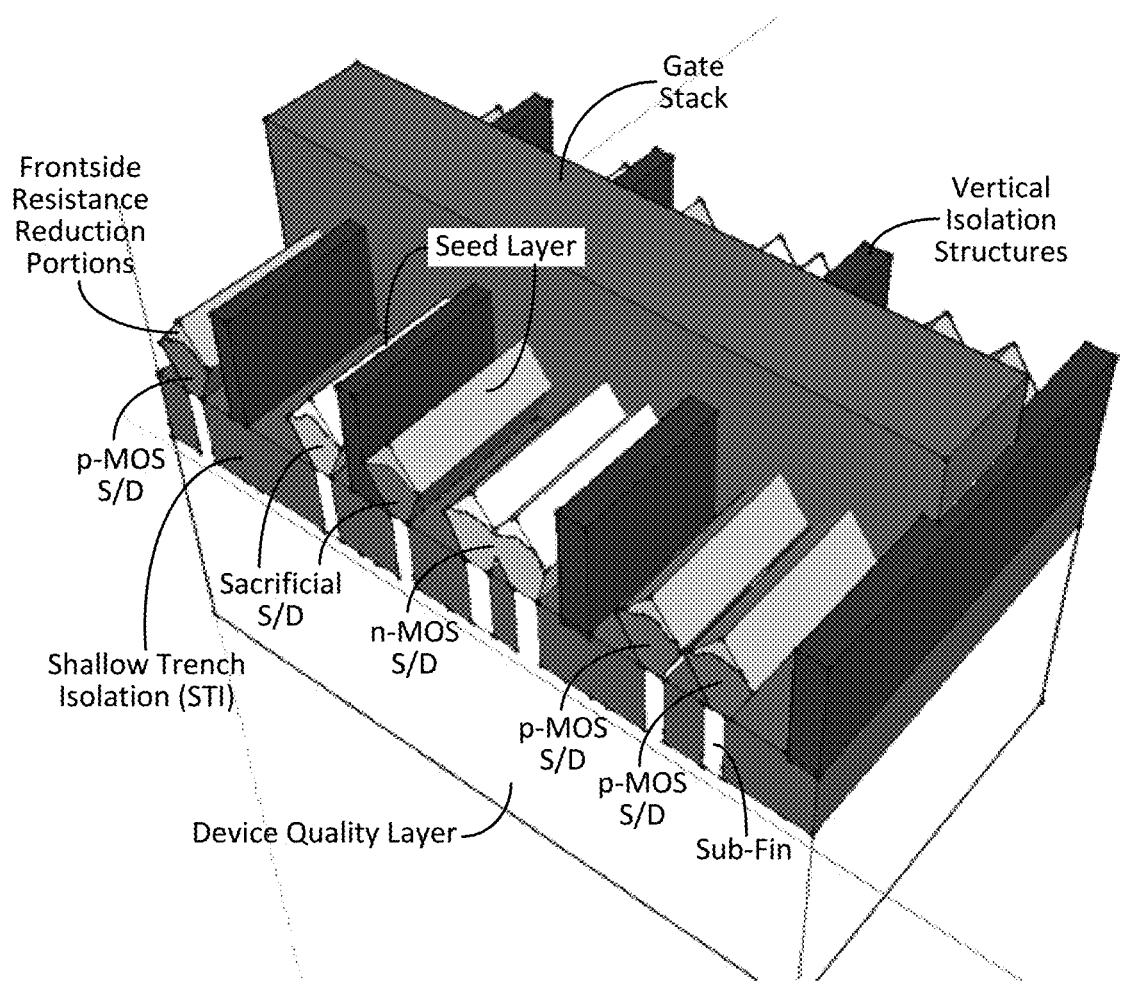

The method continues with S/D processing to form the example structure of FIG. 7G, in accordance with an embodiment. In this example embodiment, the S/D regions of the fins were replaced through a process of masking, etching, and deposition of the replacement material, which may be performed one set at a time (e.g., one of the final n-type and p-type S/D regions, then the other of the final n-type and p-type S/D regions, then the sacrificial S/D regions, in any desired order). As shown in this example, multiple S/D regions were replaced with sacrificial S/D material, to allow for that sacrificial material to be removed and replaced during backside processing, as described in more detail herein. However, note that in some embodiments, not all sacrificial material S/D regions are replaced during backside processing. For instance, in some cases unused portions of the final IC may include the sacrificial material in what would have been S/D regions (e.g., non-active regions that do not need to be replaced and thus the sacrificial material remains as an artifact of the techniques described herein). As is also shown in this example embodiment, some of the S/D regions were removed and replaced with final S/D material, such as the S/D regions indicated as p-MOS and n-MOS S/D. Such final S/D material may be contacted from the frontside and/or the backside, and is not replaced during backside processing, as will be apparent in light of this disclosure.

During the S/D processing, the active channel region is protected by the gate stack, for example. Some of the S/D regions include frontside resistance reduction portions on them as shown in FIG. 7G, which may be processed and include material similar to frontside resistance reduction layers/portions 225 as variously described herein, for example. Further, some of the S/D regions (e.g., the sacrificial S/D regions) include a seed layer on them as shown in FIG. 7G, which may be processed and include material similar to seed layer/portions 227, for example. As can be understood based on this disclosure, the seed layer is used to assist with the backside removal and replacement of the sacrificial S/D material with final S/D material. Note that the lighter S/D regions are labelled as n-type or n-MOS S/D regions, while the darker S/D region are labelled as p-type or p-MOS S/D regions for illustrative purposes only, to be able to demonstrate that the techniques described herein can be used for both p-type and n-type devices, and can even be used for complementary (e.g., CMOS) devices, as will be apparent in light of this disclosure.

Figure 7H:
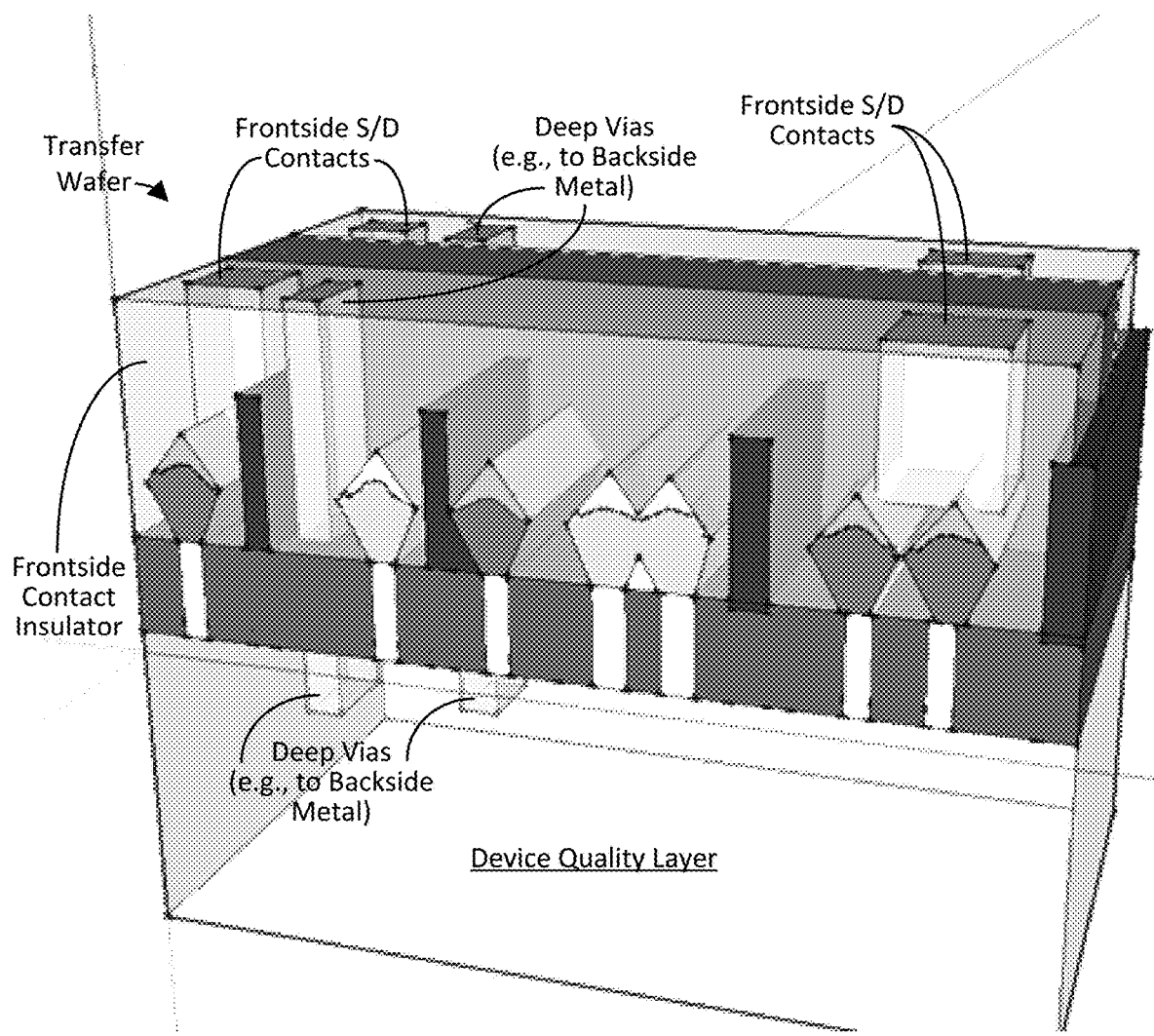
Figure 7I:
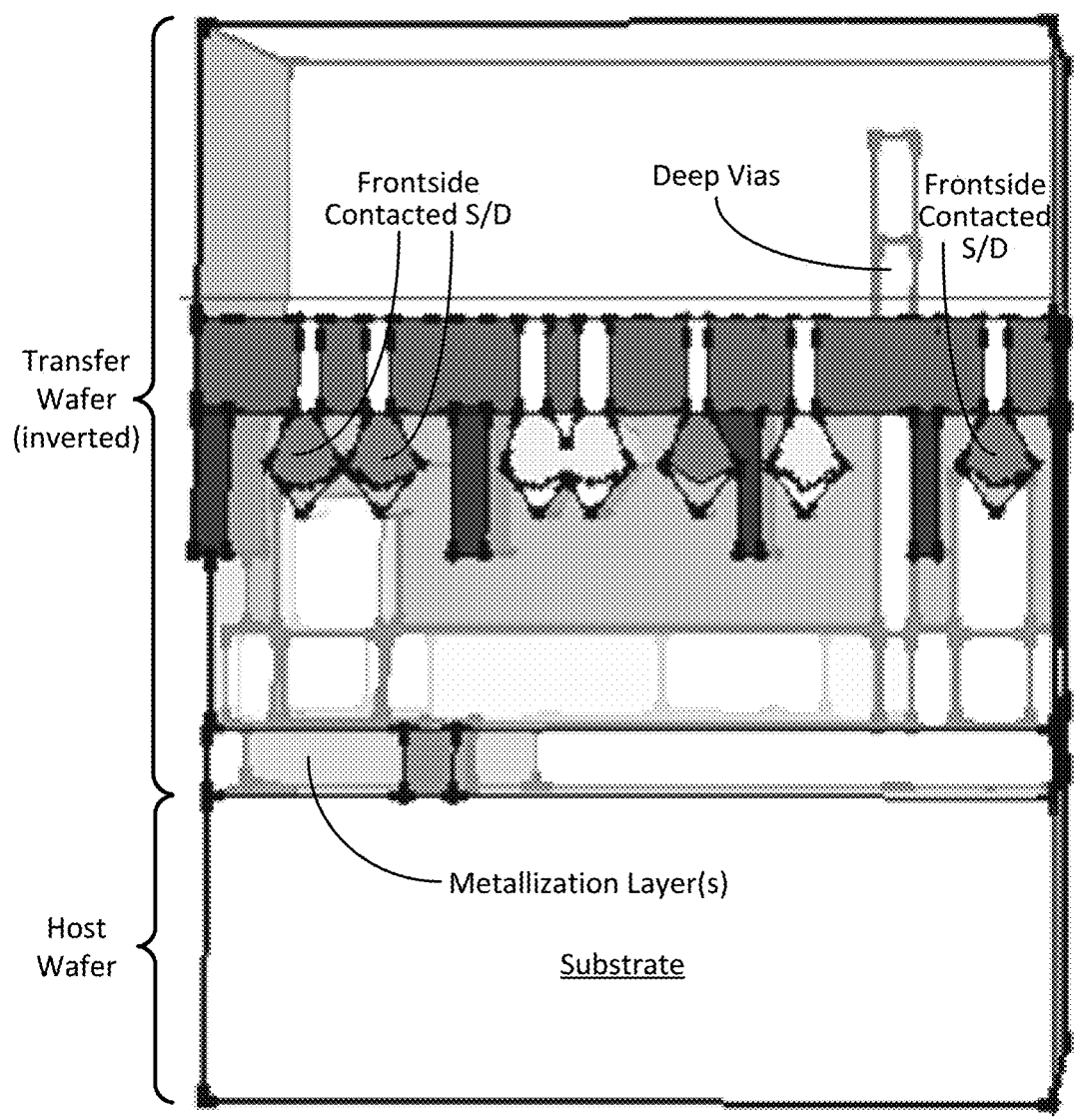

The method continues with forming contacts and/or vias as shown in the example structure of FIG. 7H, in accordance with an embodiment. In some embodiments, such processing may include depositing frontside contact insulator, planarizing/polishing the structure, forming contact/via trenches, and depositing the contact/via material (e.g., metal or metal alloy material). Note that not every S/D region is contacted from the frontside (the top, as shown in FIG. 7H), as some of the S/D regions (particularly sacrificial S/D regions) are to be contacted from the backside. Also note that some of the vias are made very deep (indicated as deep vias), such as through to the backside of the structure to allow interconnections through the device layer, for example. The method continues with back-end metallization processing to form one or more metallization layers, in some embodiments. After the transfer wafer has been processed to a desired structure, that transfer wafer (which may be referred to as the device wafer, as it includes one or more transistor devices) can be inverted and bonded to a host (or carrier) wafer, as variously described herein. The resulting structure after the inverting and bonding has been performed is shown in FIG. 7I, where there are one or more layers of metallization (specifically two, in this example embodiment) between the substrate of the host wafer and the transistor device level. In this example embodiment, the two metallization layers were formed on the transfer wafer during frontside processing.

Figure 7J:
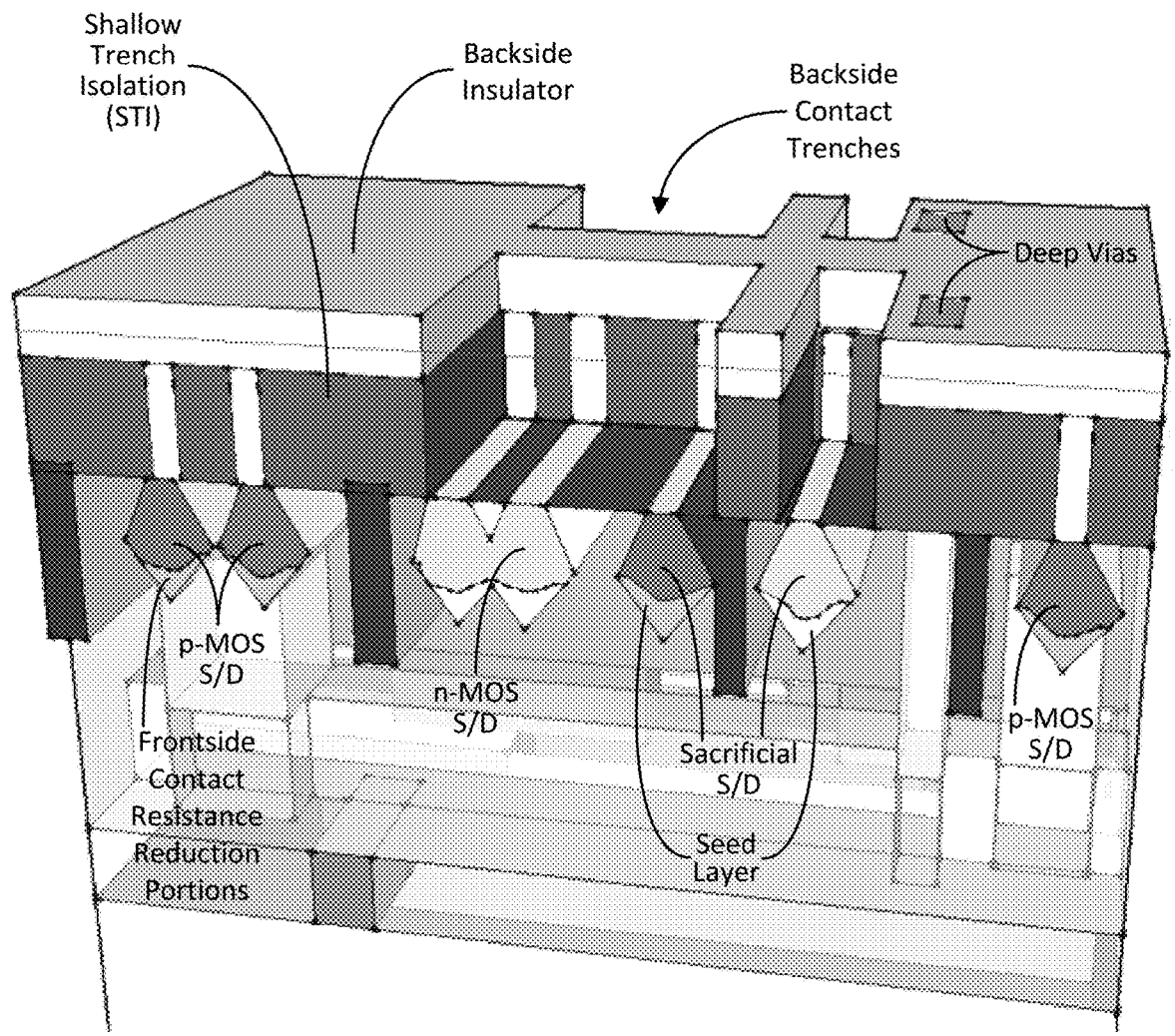

The method continues with performing backside reveal processing, depositing backside contact insulator, and forming backside contact trenches to form the example structure of FIG. 7J, in accordance with an embodiment. In some embodiments, the backside reveal processing may be performed using any suitable techniques, such as via grinding, etching, and/or CMP, as is variously described herein. After the backside reveal reaches, for example, the shallow trench isolation layer, the backside contact insulator layer may be deposited, which may include any suitable dielectric material, for example. Then, backside contact trenches can be formed, as shown in FIG. 7J, using any suitable techniques, such as one or more wet and/or dry etch processes. Note that the deep vias are indicated, as they can be used to make contact to the metallization layers below the device layer (e.g., on the frontside of the device layer, such as between transistors and the host wafer substrate). In some embodiments, p-type S/D regions (e.g., for p-MOS) and n-type S/D regions (e.g., for n-MOS) may be located in the same backside contact trench, for example. In some such embodiments, masking may be used to ensure that backside contact resistance reduction processing occurs on the correct polarity.

Figure 7K:
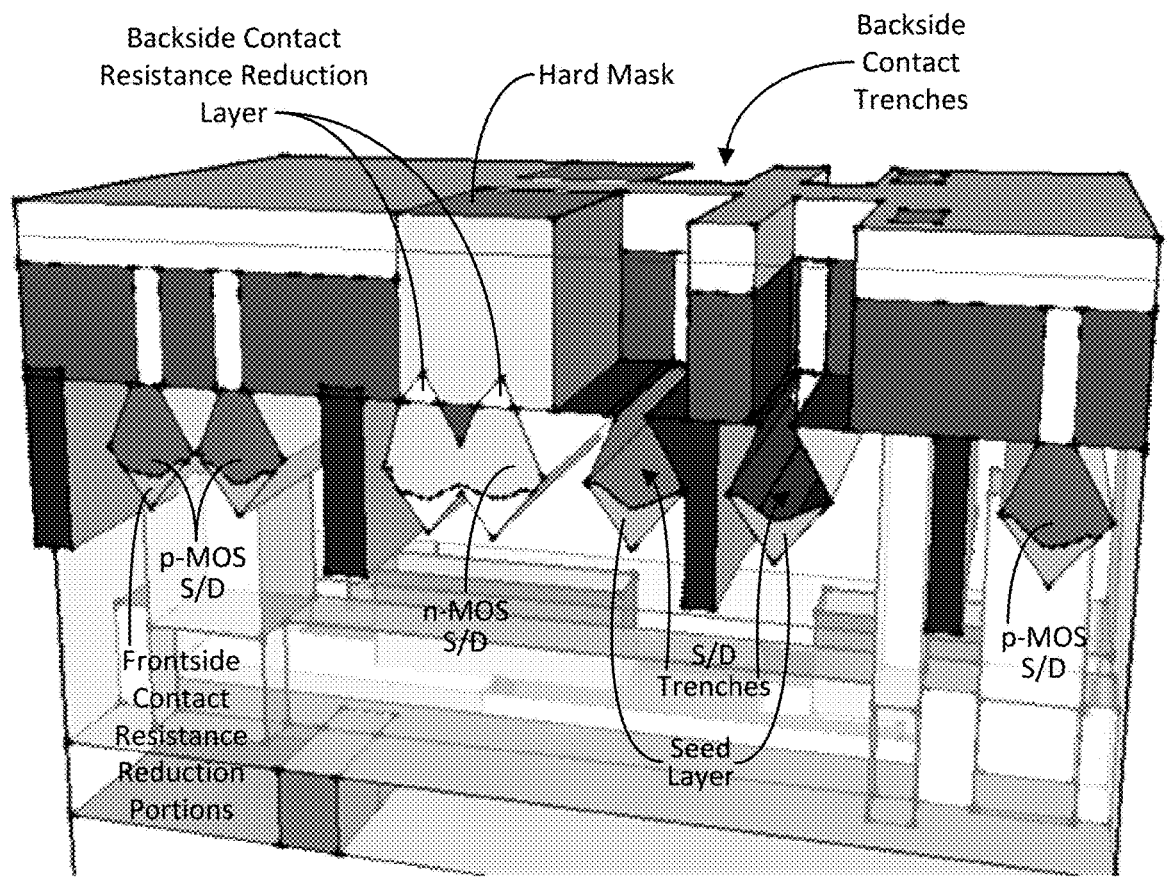

From the example structure of FIG. 7J to the example structure of FIG. 7K, multiple processes were performed. This includes forming a backside contact resistance reduction layer for the n-MOS S/D regions in the backside contact trenches. Such backside contact resistance reduction layers may be similar to the frontside contact resistance reduction layers variously described herein, except that they are formed on the backside of the S/D regions. In some embodiments, the backside contact resistance reduction layers may have been formed by masking other S/D region in the backside contact trenches and then performing the processing to form the backside contact resistance reduction layers, as can be understood based on this disclosure. In some embodiments, the backside contact resistance reduction layer may include any suitable material, such as group IV and/or group III-V material, or any other suitable material as will be apparent in light of this disclosure. In some embodiments, the backside contact resistance reduction layer may include degenerately doped material, such as including n-type and/or p-type dopant concentrations of at least 1E19, 1E20, 5E20, or 1E21 atoms per cubic cm, or some other suitable minimum threshold dopant concentration to assist with ohmic contact. In some embodiments, the backside contact resistance reduction layer may include similar material as its respective S/D region. In some such embodiments, the material composition of the backside contact resistance reduction layer, relative to the S/D region(s) for which the backside contact resistance reduction layer is used, may be different than the material composition of that S/D region(s).

For instance, in the example case of a SiGe S/D region, a backside contact resistance reduction layer for that SiGe S/D region may also include SiGe, but with a relatively increased percentage of Ge in the SiGe material. Further, in the example case of an InGaAs S/D region, a backside contact resistance reduction layer or portion for that InGaAs S/D region may also include InGaAs, but with a relatively increased percentage of In in the InGaAs material. To provide more specific examples, for illustrative purposes, in an embodiment including an Si channel p-MOS having SiGe:B S/D regions with 3E20 B atoms per cubic cm, a backside contact resistance reduction layer for the S/D regions may include SiGe:B with 5E20 B atoms per cubic cm or Ge:B with 5E20 B atoms per cubic cm, for instance. In another example case, in an embodiment including an Si channel n-MOS having Si:P S/D regions with 5E20 P atoms per cubic cm, a backside contact resistance reduction layer for the S/D regions may include Si:P with 1E21 P atoms per cubic cm. In some embodiments, the backside contact resistance reduction layer may include a doping concentration (e.g., of any suitable n-type or p-type dopants) that is at least 1E17 to 1E21 atoms per cubic cm (e.g., at least 1E20 atoms per cubic cm) greater than the dopant concentration of the S/D regions for which it is providing contact resistance reduction, or some other suitable relative amount as will be apparent in light of this disclosure.

Continuing with the processing to form the example structure of FIG. 7K, after the backside contact resistance reduction layer has been formed, those S/D regions were masked off to allow for the processing of the sacrificial S/D regions. The processing of the sacrificial S/D regions includes removing the sacrificial S/D material via a selective etch process that forms S/D trenches without completely removing the seed layer, as shown. The selective etch process may be performed as variously described herein, such as in any suitable manner as described with respect to selective etch 122. In this example embodiment, removal of the sacrificial S/D material allows for a final S/D material to be deposited on the seed layer and in the S/D trenches. The final S/D material can include relatively high doping levels (e.g., greater than 1E19, 1E20, or 1E21) without causing those dopants to diffuse into the adjacent channel regions, as the processing that would cause such diffusion has already been performed (such as high temperature anneal processes). Thus, a MOBS scheme as variously described herein can be achieved while also allowing for relatively highly doped S/D regions (e.g., to promote ohmic contact) that otherwise would not be able to be formed without diffusion of the dopants into the corresponding adjacent channel region from those highly doped S/D regions, due to forming such final relatively highly doped S/D regions later in the process during backside reveal processing.

Figure 7L:
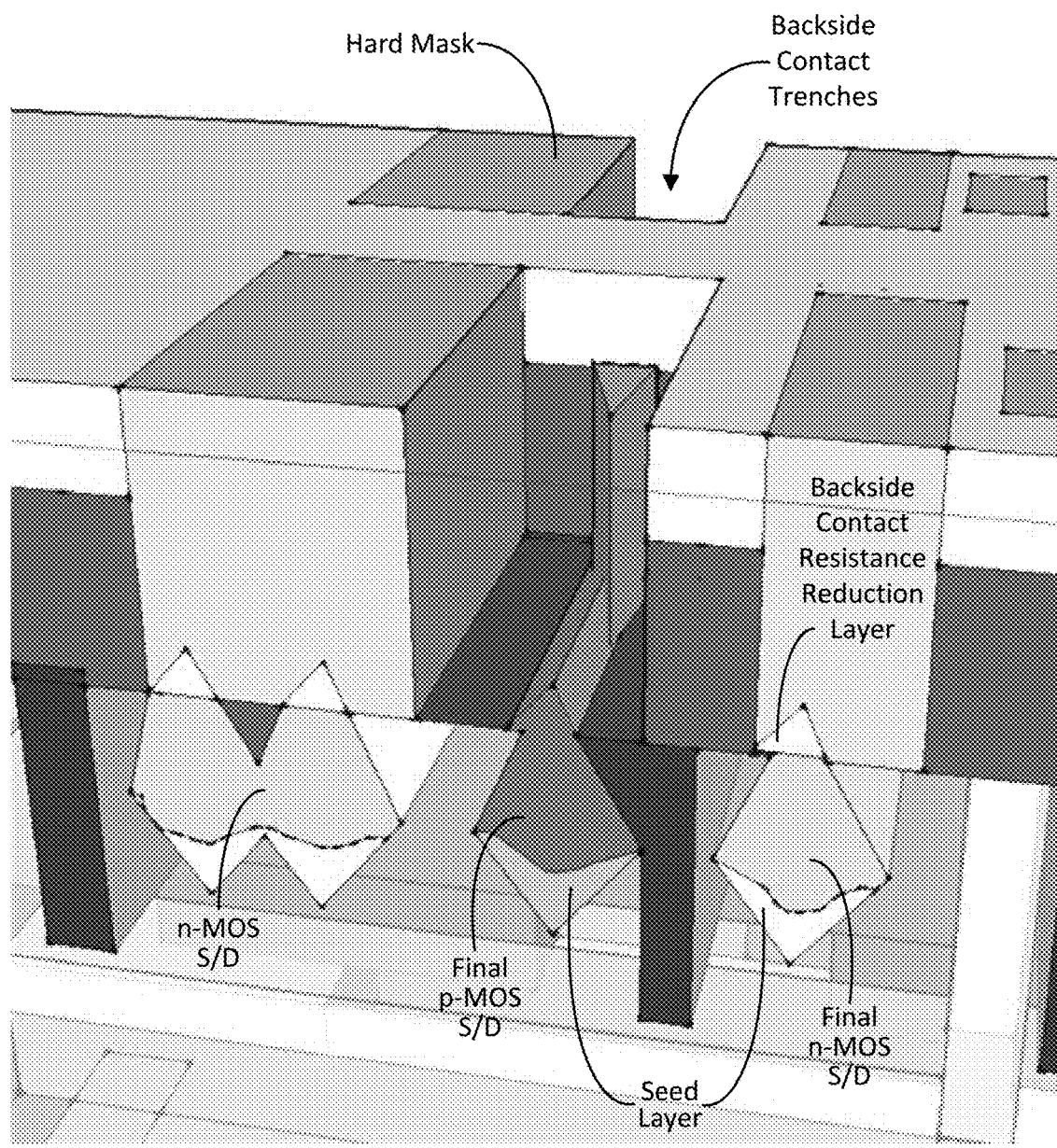

From the example structure of FIG. 7K to the example structure of FIG. 7L, multiple processes were performed. This includes forming final n-MOS and p-MOS S/D regions on the seed layer as shown. Such processing may have been performed by masking one of the final p-MOS and final n-MOS S/D regions, depositing the final material for the unmasked S/D regions, masking the other of the final p-MOS and final n-MOS S/D regions, and depositing the final material for those unmasked S/D regions, for example. Such final S/D material may be processed and include material similar to final S/D material 228 variously described herein, for example. As can be seen in FIG. 7L, final n-MOS S/D region includes backside contact resistance reduction layer, which may be processed and include similar material as the frontside and backside contact resistance reduction layers variously described herein, for example. Although all sacrificial S/D material was first removed from the IC structure and then different final S/D regions were formed using masking processes, the present disclosure is not intended to be so limited. For example, recall that in some embodiments, the sacrificial material of different S/D regions may be removed separately, prior to the formation of final material for those S/D regions. Numerous variations and configurations on the backside S/D replacement techniques described herein will be apparent in light of this disclosure.

Figure 7M:
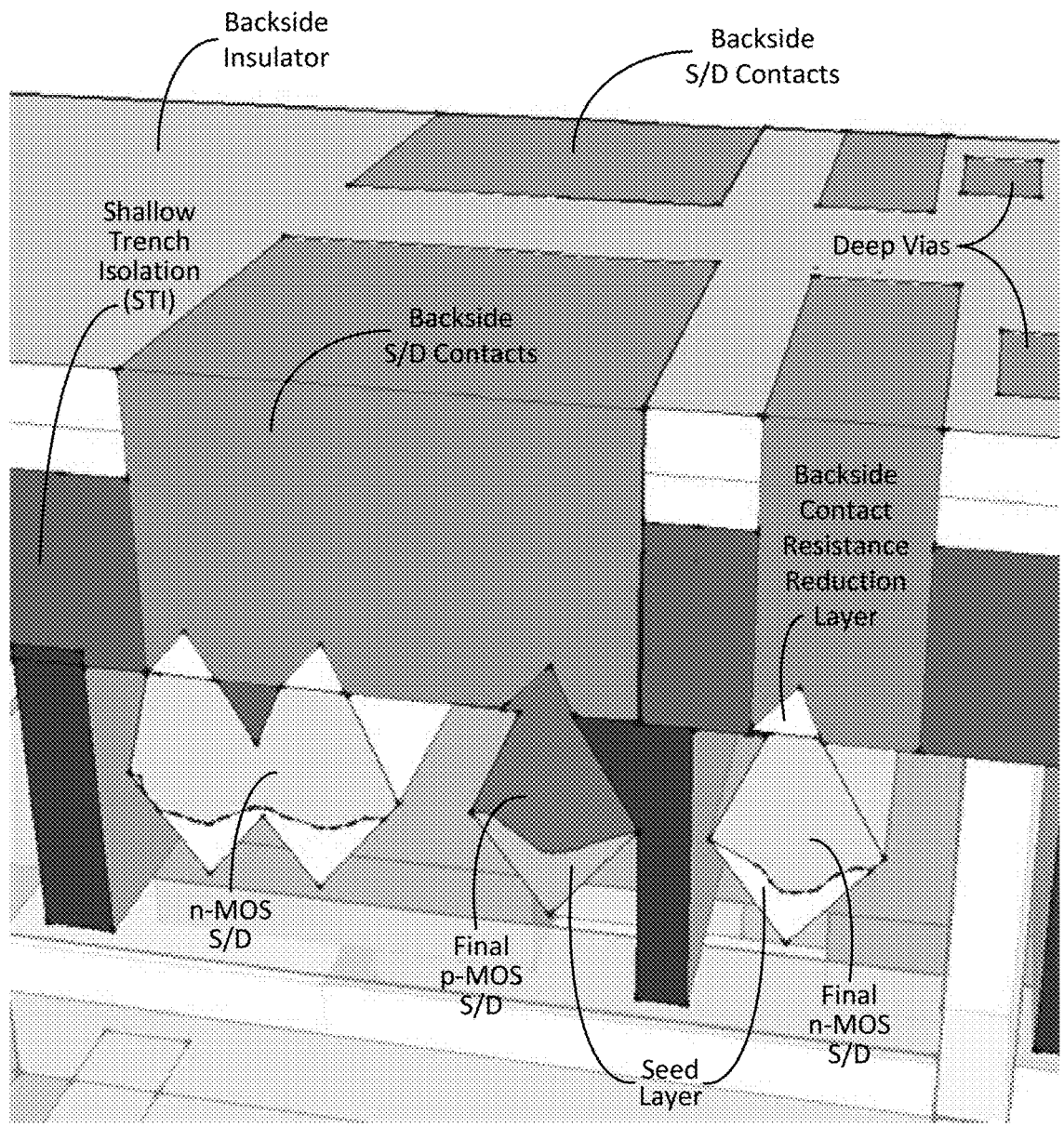

The method continues with removing the hard mask from the example IC structure of FIG. 7L and forming backside contacts in the backside contact trench locations, to form the example structure of FIG. 7M, in accordance with an embodiment. In some such embodiments, the backside contacts may be processed and include material similar to backside contact 290 as variously described herein, for example. For instance, the trenches may be filled with metal or metal alloy using silicide/germanide and an optional diffusion barrier, in some embodiments. Note that contacts can be made from both the frontside and the backside to the same S/D, but in some embodiments, contacts are made from only one of the frontside or the backside. The backside-back-end processing (referred to herein as BBE processing) may then include forming as many metallization layers/lines as desired and forming any other suitable features to complete formation of the desired IC structure. Numerous variations and configurations will be apparent in light of this disclosure.

Example System

Figure 8:
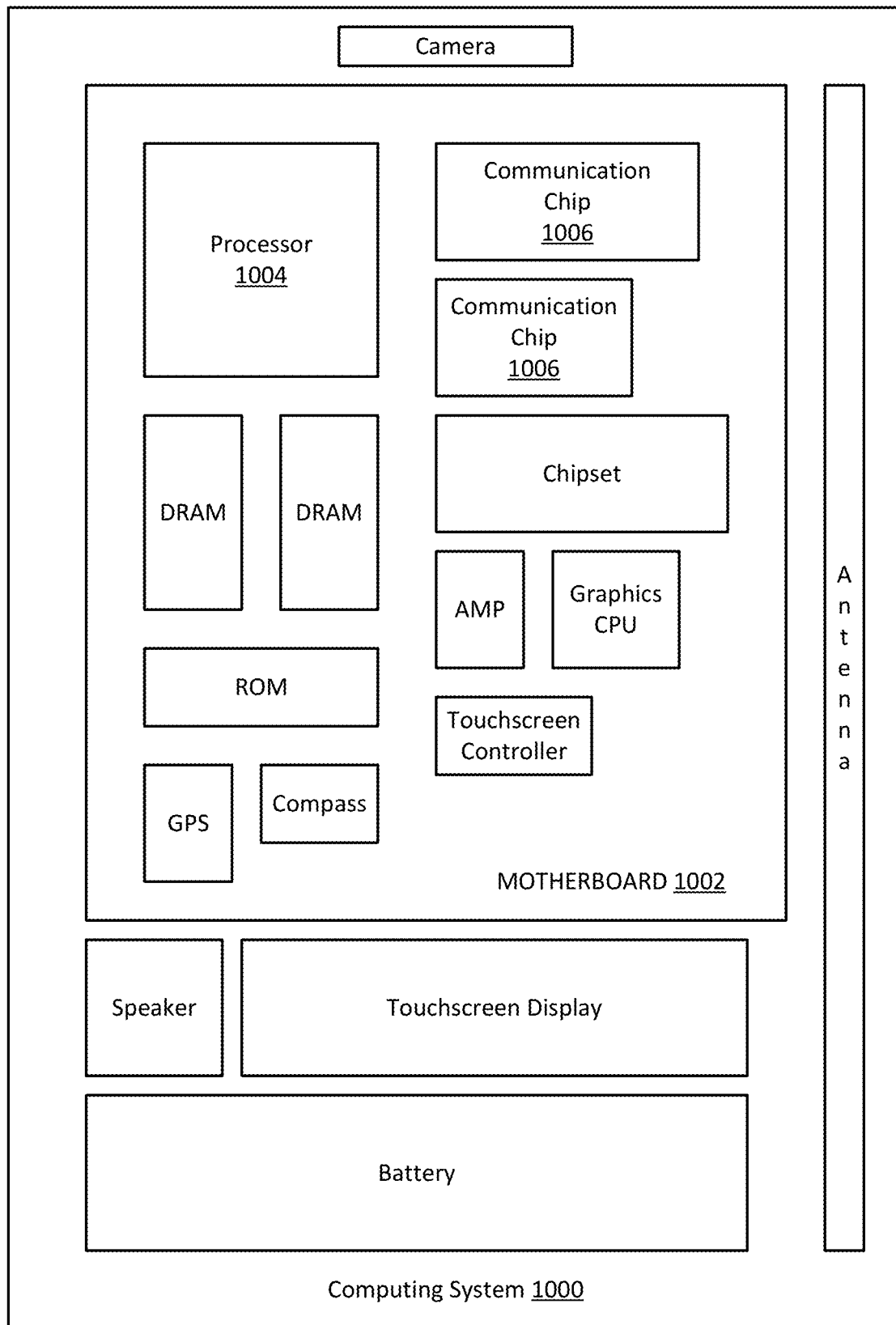
FIG. 8 illustrates a computing system implemented with integrated circuit structures and/or devices formed using the techniques disclosed herein, in accordance with some embodiments of the present disclosure.

FIG. 8 illustrates a computing system 1000 implemented with integrated circuit structures and/or devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit (IC) including: a substrate; a transistor above the substrate; at least one metallization layer below the transistor and between the transistor and the substrate; and at least one metallization layer above the transistor. The transistor in this example includes: a gate; a channel above the gate; source and drain (S/D) regions adjacent to the channel; contacts above the S/D regions; and a seed layer below the S/D regions, wherein the seed layer includes semiconductor material and has doping levels of at least 1E19 atoms per cubic centimeter (cm) less than doping levels of the S/D regions.

Example 2 includes the subject matter of Example 1, wherein the channel includes a layer of single-crystal semiconductor material having less than 1E8 dislocation defects per square cm.

Example 3 includes the subject matter of any of Examples 1-2, wherein the channel includes at least one of group IV semiconductor material and group III-V semiconductor material.

Example 4 includes the subject matter of any of Examples 1-3, wherein the transistor further includes a gate dielectric layer between the gate and the channel.

Example 5 includes the subject matter of any of Examples 1-4, wherein the S/D regions each include one of n-type and p-type dopants.

Example 6 includes the subject matter of any of Examples 1-5, wherein the S/D regions include semiconductor material having doping levels of greater than 1E20 atoms per cubic cm.

Example 7 includes the subject matter of any of Examples 1-6, wherein the contacts include one of a metal and a metal alloy material.

Example 8 includes the subject matter of any of Examples 1-7, wherein the seed layer includes at least one of group IV semiconductor material and group III-V semiconductor material.

Example 9 includes the subject matter of any of Examples 1-8, wherein the seed layer includes composite material included in the S/D regions, but with greater concentration of at least one constituent of the composite material.

Example 10 includes the subject matter of any of Examples 1-9, wherein the S/D regions and the seed layer both include silicon germanium (SiGe), and wherein the seed layer includes at least 10 percent less germanium concentration than germanium concentration in the S/D regions.

Example 11 includes the subject matter of any of Examples 1-10, wherein the seed layer includes carbon alloying of at least 1 percent.

Example 12 includes the subject matter of any of Examples 1-11, wherein the seed layer is undoped.

Example 13 includes the subject matter of any of Examples 1-12, wherein the S/D regions include additional contacts below the S/D regions, such that the seed layer is between the additional contacts and the S/D regions and such that the S/D regions are contacted from two or more sides.

Example 14 includes the subject matter of any of Examples 1-13, wherein the transistor includes one of a planar configuration, a finned configuration, and a nanowire configuration.

Example 15 includes the subject matter of any of Examples 1-14, wherein the transistor is one of a p-channel metal-oxide-semiconductor field-effect transistor (p-MOS), an n-channel metal-oxide-semiconductor field-effect transistor (n-MOS), a p-channel tunnel field-effect transistor (p-TFET), and an n-channel tunnel field-effect transistor (n-TFET).

Example 16 is a complementary metal-oxide-semiconductor (CMOS) device including the subject matter of any of Examples 1-15.

Example 17 is a computing system including the subject matter of any of Examples 1-16.

Example 18 is an integrated circuit (IC) including: a transistor above the substrate; at least one metallization layer below the transistor and between the transistor and the substrate; and at least one metallization layer above the transistor. The transistor in this example includes: a gate; a channel above the gate; source and drain (S/D) regions adjacent to the channel, wherein the S/D regions include semiconductor material and have doping levels above 1E19 atoms per cubic centimeter (cm); contacts above the S/D regions; and a seed layer below the S/D regions, wherein the seed layer includes semiconductor material and has doping levels of less than 1E19 atoms per cubic cm.

Example 19 includes the subject matter of Example 18, wherein the transistor includes a layer of single-crystal semiconductor material having less than 1E8 dislocation defects per square cm.

Example 20 includes the subject matter of any of Examples 18-19, wherein the channel includes at least one of group IV semiconductor material and group III-V semiconductor material.

Example 21 includes the subject matter of any of Examples 18-20, wherein the transistor further includes a gate dielectric layer between the gate and the channel.

Example 22 includes the subject matter of any of Examples 18-21, wherein the S/D regions each include one of n-type and p-type dopants.

Example 23 includes the subject matter of any of Examples 18-22, wherein the S/D regions have doping levels of greater than 1E20 atoms per cubic cm.

Example 24 includes the subject matter of any of Examples 18-23, wherein the contacts include one of a metal and a metal alloy material.

Example 25 includes the subject matter of any of Examples 18-24, wherein the seed layer includes at least one of group IV semiconductor material and group III-V semiconductor material.

Example 26 includes the subject matter of any of Examples 18-25, wherein the seed layer includes composite material included in the S/D regions, but with greater concentration of at least one constituent of the composite material.

Example 27 includes the subject matter of any of Examples 18-26, wherein the S/D regions and the seed layer both include silicon germanium (SiGe), and wherein the seed layer includes at least 10 percent less germanium concentration than germanium concentration in the S/D regions.

Example 28 includes the subject matter of any of Examples 18-27, wherein the seed layer includes carbon alloying of at least 1 percent.

Example 29 includes the subject matter of any of Examples 18-28, wherein the seed layer is undoped.

Example 30 includes the subject matter of any of Examples 18-29, wherein the S/D regions include additional contacts below the S/D regions, such that the seed layer is between the additional contacts and the S/D regions and such that the S/D regions are contacted from two or more sides.

Example 31 includes the subject matter of any of Examples 18-30, wherein the transistor includes one of a planar configuration, a finned configuration, and a nanowire configuration.

Example 32 includes the subject matter of any of Examples 18-31, wherein the transistor is one of a p-channel metal-oxide-semiconductor field-effect transistor (p-MOS), an n-channel metal-oxide-semiconductor field-effect transistor (n-MOS), a p-channel tunnel field-effect transistor (p-TFET), and an n-channel tunnel field-effect transistor (n-TFET).

Example 33 is a complementary metal-oxide-semiconductor (CMOS) device including the subject matter of any of Examples 18-32.

Example 34 is a computing system including the subject matter of any of Examples 18-33.

Example 35 is a method of forming an integrated circuit, the method including: providing a first substrate; depositing a sacrificial layer on the first substrate; forming a single-crystal semiconductor material layer on the sacrificial layer; forming a transistor device using the semiconductor material layer, the transistor including a gate, a channel below the gate, source and drain (S/D) regions adjacent to the channel, and a seed layer above the S/D regions, wherein the S/D regions include sacrificial S/D material; bonding a metallization layer of the first transistor to a metallization layer of a second substrate; removing the sacrificial layer to remove the first substrate; forming contact trenches to access a side of the S/D regions opposite the second substrate; selectively etching the sacrificial S/D material without completely removing the seed layer to form S/D trenches; forming final S/D material on the seed layer and in the S/D trenches; and forming contacts in the contact trenches.

Example 36 includes the subject matter of Example 35, wherein the sacrificial layer is an etch-stop layer and wherein removing the first substrate includes grinding the first substrate to near the etch-stop layer followed by at least one of an etch and polish process used to remove the remainder of the first substrate material.

Example 37 includes the subject matter of Example 35, wherein the sacrificial layer is a fast-etch layer and wherein removing the first substrate includes a lateral etch of the fast-etch layer to allow for liftoff of the first substrate.

Example 38 includes the subject matter of Example 35, wherein the sacrificial layer is a multilayer stack including a fast-etch layer and an etch-stop layer and removing the first substrate includes a lateral etch of the fast-etch layer to allow for liftoff of the first substrate followed by at least one of an etch and polish process used to at least partially remove the etch-stop layer.

Example 39 includes the subject matter of any of Examples 35-38, wherein selectively etching the sacrificial S/D material includes using a given etchant that removes the sacrificial S/D material at least 5 times faster than the given etchant removes material of the seed layer.

Example 40 includes the subject matter of any of Examples 35-39, wherein the seed layer includes at least 1E18 atoms per cubic centimeter (cm) less dopants than the sacrificial S/D material.

Example 41 includes the subject matter of any of Examples 35-40, wherein the seed layer includes composite material included in the sacrificial S/D material, but with greater concentration of at least one constituent of the composite material.

Example 42 includes the subject matter of any of Examples 35-41, wherein the seed layer includes carbon alloying of at least 1 percent.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure comprising:
   a first transistor including a first semiconductor region, a first source region adjacent a first side of the first semiconductor region, the first source region including an upper and a lower portion, a first drain region adjacent to a second side of the first semiconductor region, the first drain region including an upper and a lower portion, a first source contact above and at least on the upper portion of the first source region, and a first drain contact above and at least on the upper portion of the first drain region, wherein there is not a contact on the lower portion of one or both of the first source region or the first drain region;
   a second transistor including a second semiconductor region, a second source region adjacent a first side of the second semiconductor region, the second source region including an upper and a lower portion, a second drain region adjacent to a second side of the second semiconductor region, the second drain region including an upper and a lower portion, a second source contact below and at least on the lower portion of the second source region, and a second drain contact below and at least on the lower portion of the second drain region; and
   a gate stack at least above and on sidewalls of the first semiconductor region, and also at least above and on sidewalls of the second semiconductor region.

2. The integrated circuit structure of claim 1, further comprising a vertical isolation structure between the first transistor and the second transistor, the vertical isolation structure including an electrically insulating material, such that the vertical isolation structure is between the first source region and the second source region, and is also between the first drain region and the second drain region.

3. The integrated circuit structure of claim 1, wherein the first semiconductor region includes group IV semiconductor material and the second semiconductor region includes group III-V semiconductor material.

4. The integrated circuit structure of claim 1, wherein the first semiconductor region includes germanium, and the second semiconductor region includes no germanium.

5. The integrated circuit structure of claim 1, wherein the first source region and the first drain region each includes one of an n-type dopant or a p-type dopant, and the second source region and the second drain region each includes the other of an n-type dopant or a p-type dopant.

6. The integrated circuit structure of claim 1, wherein:
   the lower portion of the first source region is compositionally distinct from the upper portion of the first source region, and the lower portion of the first drain region is compositionally distinct from the upper portion of the first drain region; and/or
   the lower portion of the second source region is compositionally distinct from the upper portion of the second source region, and the lower portion of the second drain region is compositionally distinct from the upper portion of the second drain region.

7. The integrated circuit structure of claim 1, wherein the upper portion of the first source region and the upper portion of the first drain region each comprises a layer of resistance reducing material, such that the layer of resistance reducing material of the first source region is in contact with the first source contact, and the layer of resistance reducing material of the first drain region is in contact with the first drain contact.

8. The integrated circuit structure of claim 1, wherein the upper portion of the second source region and the upper portion of the second drain region are undoped, and the lower portion of the second source region and the lower portion of the second drain region are doped.

9. The integrated circuit structure of claim 1, wherein the upper portion of the second source region and the upper portion of the second drain region are doped to a first concentration, and the lower portion of the second source region and the lower portion of the second drain region are doped to a second concentration, the second concentration greater than the first concentration.

10. An integrated circuit structure comprising:
    a first transistor including a first semiconductor region, a first source region adjacent a first side of the first semiconductor region, the first source region including an upper and a lower portion, a first drain region adjacent to a second side of the first semiconductor region, the first drain region including an upper and a lower portion, a first source contact above and at least on the upper portion of the first source region, and a first drain contact above and at least on the upper portion of the first drain region, wherein there is not a contact on the lower portion of one or both of the first source region or the first drain region;
    a second transistor including a second semiconductor region, a second source region adjacent a first side of the second semiconductor region, the second source region including an upper and a lower portion, a second drain region adjacent to a second side of the second semiconductor region, the second drain region including an upper and a lower portion, a second source contact below and at least on the lower portion of the second source region, and a second drain contact below and at least on the lower portion of the second drain region;

a gate stack at least above and on sidewalls of the first semiconductor region, and also at least above and on sidewalls of the second semiconductor region; and a vertical isolation structure between the first transistor and the second transistor, the vertical isolation structure including an electrically insulating material, such that the vertical isolation structure is between the first source region and the second source region, and is also between the first drain region and the second drain region; wherein the first source region and the first drain region each includes one of an n-type dopant or a p-type dopant, and the second source region and the second drain region each includes the other of an n-type dopant or a p-type dopant.

11. The integrated circuit structure of claim 10, wherein the first semiconductor region includes group IV semiconductor material and the second semiconductor region includes group III-V semiconductor material.

12. The integrated circuit structure of claim 10, wherein the first semiconductor region includes germanium, and the second semiconductor region includes no germanium.

13. The integrated circuit structure of claim 10, wherein:
the lower portion of the first source region is compositionally distinct from the upper portion of the first source region, and the lower portion of the first drain region is compositionally distinct from the upper portion of the first drain region; and/or
the lower portion of the second source region is compositionally distinct from the upper portion of the second source region, and the lower portion of the second drain region is compositionally distinct from the upper portion of the second drain region.

14. The integrated circuit structure of claim 10, wherein the upper portion of the first source region and the upper portion of the first drain region each comprises a layer of resistance reducing material, such that the layer of resistance reducing material of the first source region is in contact with the first source contact, and the layer of resistance reducing material of the first drain region is in contact with the first drain contact.

15. The integrated circuit structure of claim 10, wherein the upper portion of the second source region and the upper portion of the second drain region are undoped, and the lower portion of the second source region and the lower portion of the second drain region are doped.

16. The integrated circuit structure of claim 10, wherein the upper portion of the second source region and the upper portion of the second drain region are doped to a first concentration, and the lower portion of the second source region and the lower portion of the second drain region are doped to a second concentration, the second concentration greater than the first concentration.

17. An integrated circuit, comprising:
a semiconductor region;
a gate structure at least above the semiconductor region, the gate structure including a gate electrode and a gate dielectric, the gate dielectric between the gate electrode and the semiconductor region;
a source region adjacent a first side of the gate structure and in contact with the semiconductor region, the source region including a lower portion and an upper portion, the lower portion of the source region being compositionally distinct from the upper portion of the source region;
a drain region adjacent a second side of the gate structure and in contact with the semiconductor region, the drain region including a lower portion and an upper portion, the lower portion of the drain region being compositionally distinct from the upper portion of the drain region;
a backside source contact structure in contact with the lower portion of the source region; and
a backside drain contact structure in contact with the lower portion of the drain region, wherein there is not a contact on the upper portion of one or both of the source region or the drain region.

18. The integrated circuit of claim 17, wherein:
the upper portion of the source region is undoped, and the lower portion of the source region comprises one or more dopant impurities; and
the upper portion of the drain region is undoped, and the lower portion of the drain region comprises the one or more dopant impurities.

19. The integrated circuit of claim 17, wherein:
the upper portion of the source region has a first dopant concentration, and the lower portion of the source region has a second dopant concentration that is greater than the first dopant concentration; and
the upper portion of the drain region has a first dopant concentration, and the lower portion of the drain region has a second dopant concentration that is greater than the first dopant concentration.

20. The integrated circuit of claim 17, wherein the semiconductor region is a first semiconductor region, the source region is a first source region, and the drain region is a first drain region, the integrated circuit further comprising:
a second semiconductor region;
a second source region adjacent the first side of the gate structure and in contact with the second semiconductor region;
a second drain region adjacent the second side of the gate structure and in contact with the second semiconductor region; and
a frontside source contact structure in contact with an upper portion of the second source region a frontside drain contact structure in contact with an upper portion of the second drain region.

* * * * *